United States Patent
Taniguchi

(10) Patent No.: US 6,535,080 B2
(45) Date of Patent: Mar. 18, 2003

(54) SURFACE ACOUSTIC WAVE LADDER FILTER WITH BALANCED INPUT AND OUTPUT TERMINALS

(75) Inventor: Norio Taniguchi, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/778,428

(22) Filed: Feb. 7, 2001

(65) Prior Publication Data

US 2001/0013816 A1 Aug. 16, 2001

(30) Foreign Application Priority Data

Feb. 7, 2000 (JP) ........................................ 2000-029246

(51) Int. Cl.⁷ ................................................ H03H 9/64
(52) U.S. Cl. .................... 333/193; 333/195; 310/313 B
(58) Field of Search ................................. 333/193–196; 310/313 R, 313 B, 313 C, 313 D

(56) References Cited

U.S. PATENT DOCUMENTS

| | | | | |
|---|---|---|---|---|
| 5,499,003 A | | 3/1996 | Davenport | .................. 333/195 |
| 5,508,667 A | * | 4/1996 | Kondratiev et al. | ......... 333/194 |
| 5,682,126 A | * | 10/1997 | Plesski et al. | ............... 333/193 |
| 5,847,626 A | | 12/1998 | Taguchi et al. | .............. 333/193 |

FOREIGN PATENT DOCUMENTS

| | | |
|---|---|---|
| EP | 541 284 | 5/1993 |
| EP | 0 668 655 A1 | 8/1995 |
| JP | 6-69750 | 3/1994 |
| JP | 11-346142 | 12/1999 |
| JP | 2000-22493 | * 1/2000 |
| JP | 2000-114917 | * 4/2000 |
| JP | 2001-7680 | * 1/2001 |

* cited by examiner

*Primary Examiner*—Barbara Summons
(74) *Attorney, Agent, or Firm*—Keating & Bennett, LLP

(57) ABSTRACT

A surface acoustic wave filter includes a piezoelectric substrate and a plurality of surface acoustic wave resonators provided on the piezoelectric substrate and connected to define a ladder filter circuit. The filter circuit includes input-side balanced signal terminals A1 and A2 connected to an external balanced circuit, output-side balanced signal terminals B1 and B2 connected to an external balanced circuit, at least one first series arm surface acoustic wave resonator connected in series between the input-side balanced signal terminal A1 and the output-side balanced signal terminal B1, at least one second series arm surface acoustic wave resonator connected in series between the input-side balanced signal terminal A2 and the output-side balanced signal terminal B2, and at least one impedance element connected between a first signal line connecting the input-side balanced signal terminal A1 to the output-side balanced signal terminal B1 and a second signal line connecting the input-side balanced signal terminal A2 to the output-side balanced signal terminal B2.

12 Claims, 26 Drawing Sheets

SURFACE ACOUSTIC WAVE LADDER FILTER WITH BALANCED INPUT AND OUTPUT TERMINALS

BACKGROUND OF THE INVENTION

1. Field of the Invention

The present invention relates to surface acoustic wave filters and more particularly, to a surface acoustic wave filter having a ladder circuit construction that includes a balanced input/output.

2. Description of the Related Art

A plurality of conventional surface acoustic wave filters have been used as band-pass filters in mobile communication devices. Particularly, a variety of surface acoustic wave filters have been proposed which have a ladder circuit construction with low insertion loss and wide bandwidth.

FIG. 27 is a circuit diagram showing a basic construction of the surface acoustic wave filter which has the ladder circuit construction. A signal line which establishes connection between an input terminal 201 and an output terminal (not shown) defines a series arm. The series arm is connected to a series resonator 202. The series arm and the ground potential define a parallel arm therebetween. The parallel arm is connected to a parallel arm resonator 203. Although the filter circuit having a single stage is shown in FIG. 27, the surface acoustic wave filter usually has a multistage construction in which a plurality of series-arm resonators and parallel-arm resonators is provided.

The series-arm resonator and the parallel-arm resonator are constructed using one-port surface acoustic wave resonator. The one-port surface acoustic wave resonator is provided with an IDT electrode disposed in the center of the propagation direction of a surface acoustic wave and a reflector disposed on both sides of the IDT electrode in the propagation direction of the surface acoustic wave.

FIG. 28 shows one example of typical filtering characteristics of the surface acoustic wave filter having the above-described ladder circuit construction.

In EP0541284A2, a surface acoustic wave filter is disclosed having the ladder circuit construction in which an increase in the bandwidth as well as in the attenuation is achieved by adding an inductance component to the parallel arm resonator in series. Particularly, by constructing this inductance component via wire bonding, the size of a chip and its package are not increased.

That is, in an unbalanced surface acoustic wave filter in which a surface acoustic wave filter element and the package are electrically connected via a bonding wire, the inductance component of the bonding wire produces filtering characteristics thereof having a wider band as compared with filtering characteristics of a solely surface acoustic wave filter.

However, in the surface acoustic wave filter disclosed in EP0541284A2, the surface acoustic wave filter operates normally in an unbalanced-input-to-unbalanced-output circuit while not operating normally in a balanced-input-to-balanced-output circuit.

To solve this problem, a surface acoustic wave filter having the balanced ladder circuit construction corresponding to the balanced circuit is disclosed in U.S. Pat. No. 5,499,003. In FIG. 29, the circuit construction of the surface acoustic wave filter disclosed in this related art is shown.

Here, series arm resonators S1 to S4 and series arm resonators S5 to S8 are connected, respectively, to a first series arm defined by a signal line between a hot-side input terminal 211 and a hot-side output terminal 212 and a second series arm defined by a signal line between a ground-side input terminal 213 and a ground-side output terminal 214. In addition, a plurality of parallel arms are connected between the first and second series arms. Parallel arm resonators P1, P2, and P3 are connected to corresponding parallel arms.

As described above, by connecting parallel arms between the first and second series arms, a balanced surface acoustic wave filter is obtained.

Furthermore, a ladder surface acoustic wave filter corresponding to the unbalanced input/output is disclosed in Japanese Unexamined Patent Application Publication No. 6-69750. The ladder surface acoustic wave filter disclosed therein corresponds to the unbalanced input/output by optimizing the electrode capacitance of the series arm resonator and that of the parallel arm resonator.

In a balanced ladder surface acoustic wave filter disclosed in U.S. Pat. No. 5,499,003, an inductance component is not added to the parallel arm resonator. Accordingly, it is difficult to increase the bandwidth and the attenuation due to the above-described addition of the inductance component. In the surface acoustic wave filter described in this related art, the parallel arm resonator is limited to the surface acoustic wave resonator, and the band-pass width depends on a piezoelectric substrate. Consequently, the degree of freedom of band-pass width design is greatly reduced.

Furthermore, in the balanced ladder surface acoustic wave filter described in U.S. Pat. No. 5,499,003, electrical characteristics thereof can be measured only when the balanced circuit is connected thereto. Generally, network analyzers, which are used for evaluating electrical characteristics of the filter, are unbalanced circuits. Therefore, to measure electrical characteristics of the above surface acoustic wave filter using the network analyzer, a balance-to-unbalance transformer must be inserted therebetween.

One example of the above-described measuring circuit is shown in FIG. 30. In FIG. 30, reference numeral 221 represents a surface acoustic wave filter and reference numerals 222 and 223 represent balance-to-unbalance transformers. However, due to loss caused by the resistance and reflection included in these balance-to-unbalance transformers 222 and 223, highly accurate evaluation of filtering characteristics is very difficult to achieve. Furthermore, the operating frequency bands of the balance-to-unbalance transformers 222 and 223 are generally narrow and simultaneous evaluation of a wide frequency band is very difficult. In addition, variations in the balance-to-unbalance transformers 222 and 223 make it difficult to accurately and repeatedly evaluate the filter characteristics.

SUMMARY OF THE INVENTION

To overcome the above-described problems with the prior art, preferred embodiments of the present invention provide a surface acoustic wave filter having a ladder circuit construction which eliminates the problems with the foregoing related art, is capable of corresponding to the balanced input/output, has a wide frequency band and low loss, has a high degree of freedom of band width design, and is capable of accurately and easily having the filter characteristics thereof measured.

According to a first preferred embodiment of the present application, a surface acoustic wave filter includes a piezoelectric substrate and a plurality of surface acoustic wave resonators provided on the piezoelectric substrate wherein a ladder filter circuit including the plurality of surface acoustic wave resonators is constructed. The filter circuit includes input-side balanced signal terminals A1 and A2 connected to an external balanced circuit, output-side balanced signal terminals B1 and B2 connected to an external balanced circuit, at least one first series arm surface acoustic wave resonator connected in series between the input-side balanced signal terminal A1 and the output-side balanced signal terminal B1, at least one second series arm surface acoustic wave resonator connected in series between the input-side balanced signal terminal A2 and the output-side balanced signal terminal B2, and at least one impedance element connected between a first signal line connecting the input-side balanced signal terminal A1 to the output-side balanced signal terminal B1 and a second signal line connecting the input-side balanced signal terminal A2 to the output-side balanced signal terminal B2.

In a specific aspect of the surface acoustic wave filter according to the first preferred embodiment, at least one third surface acoustic wave resonator connected in series with the impedance element is provided.

In another specific aspect of the surface acoustic wave filter according to the first preferred embodiment, at least two of the third surface acoustic wave reonators are further provided.

In the surface acoustic wave filter according to the first preferred embodiment, as described below, the impedance element is added to the parallel arm resonator, wherein a wideband balanced or narrowband balanced surface acoustic filter is obtained. As described below, preferable characteristics which are not obtained by an unbalanced surface acoustic filter described in EP0541284A2 are obtained.

In a second preferred embodiment of the present application, a surface acoustic wave filter includes a piezoelectric substrate and a plurality of surface acoustic wave resonators provided on the piezoelectric substrate wherein a ladder filter circuit is constructed to include the plurality of surface acoustic wave resonators. The filter circuit includes input-side balanced signal terminals A1 and A2 connected to an external balanced circuit, output-side balanced signal terminals B1 and B2 connected to an external balanced circuit, at least one first series arm surface acoustic wave resonator connected in series between the input-side balanced signal terminal A1 and the output-side balanced signal terminal B1, at least one second series arm surface acoustic wave resonator connected in series between the input-side balanced signal terminal A2 and the output-side balanced signal terminal B2, and at least two third series arm surface acoustic wave resonators each led from a first signal line connecting the input-side balanced signal terminal A1 to the output-side balanced signal terminal B1 and a second signal line connecting the input-side balanced signal terminal A2 to the output-side balanced signal terminal B2, wherein a terminal of the third surface acoustic wave resonator which is not connected to the first signal line or the second signal line is grounded.

In the surface acoustic wave filter according to the second preferred embodiment, at least two third surface acoustic wave resonators are each led from the first signal line and the second signal line, and a terminal of the third surface acoustic wave resonator which is not connected to the first signal line or the second signal line is grounded. Therefore, as described below, wideband or narrow band filtering characteristics are obtained. In addition, without using a balance-to-unbalance transformer, filtering characteristics are very accurately determined.

In a specific aspect of the second preferred embodiment, an impedance element is inserted between the terminal of the third surface acoustic wave resonator which is not connected to the first signal line or the second signal line and a ground potential.

In a more specific aspect of the surface acoustic wave filter according to the second preferred embodiment, the ratio of the electrode capacitance of the third surface acoustic wave resonator led from the first signal line and the second signal line to the electrode capacitance of the third surface acoustic wave resonator led from the second signal line and the first signal line is approximately 1.4 or less. This enables the filtering characteristics to be more accurately measured. In addition, the balance is greatly improved.

In a more specific aspect of the surface acoustic wave filter according to the second preferred embodiment, at least one second impedance element is connected in series with the first series arm surface acoustic wave resonator between the input-side balanced signal terminal A1 and the output-side balanced signal terminal B1, and a third impedance element is connected in series with the second series arm surface acoustic wave resonator between the input-side balanced signal terminal A2 and the output-side balanced signal terminal B2.

Thus, by adding the impedance element to not only the series arm but also the parallel arm, greatly improved filtering characteristics are obtained. In particular, VSWR (reflection property) is greatly improved.

In the first and second preferred embodiments, the above impedance element is not particularly limited. An inductance element, a capacitance element, or a resonating element can be used as the impedance element.

When an inductance element is used as the impedance element, expansion of the bandwidth is achieved. When the capacitance element is used as the impedance element, narrowband filtering characteristics are obtained. When the resonating element is used as the impedance element, resonating characteristics having a capacitance ratio (the parameter C1/C0 which determines the distance between the resonating frequency and the anti-resonating frequency) that cannot be achieved by the surface acoustic wave resonator is obtained. As a result, the wideband or narrowband filtering characteristics are realized.

The inductance element may be defined by a bonding wire. Alternatively, a package for storing the piezoelectric substrate therein is further provided and a strip line that is connected to a signal line on the piezoelectric substrate is provided on the package, wherein the inductance element is defined by the strip line.

The above-described capacitance element may be defined by an electrode provided on the piezoelectric substrate. Alternatively, to construct the capacitance element on the piezoelectric substrate, an electrode for obtaining the capacitance may be discretely provided.

The above-described resonating element is not particularly limited, and can be constructed by combining inductance and capacitance elements.

Other features, elements, characteristics and advantages of the present invention will become apparent from the detailed description of preferred embodiments thereof with reference to the attached drawings.

DETAILED DESCRIPTION OF PREFERRED EMBODIMENTS

Hereinafter, preferred embodiments of the present invention are described with reference to drawings, such that the present invention becomes apparent.

Figure 1:
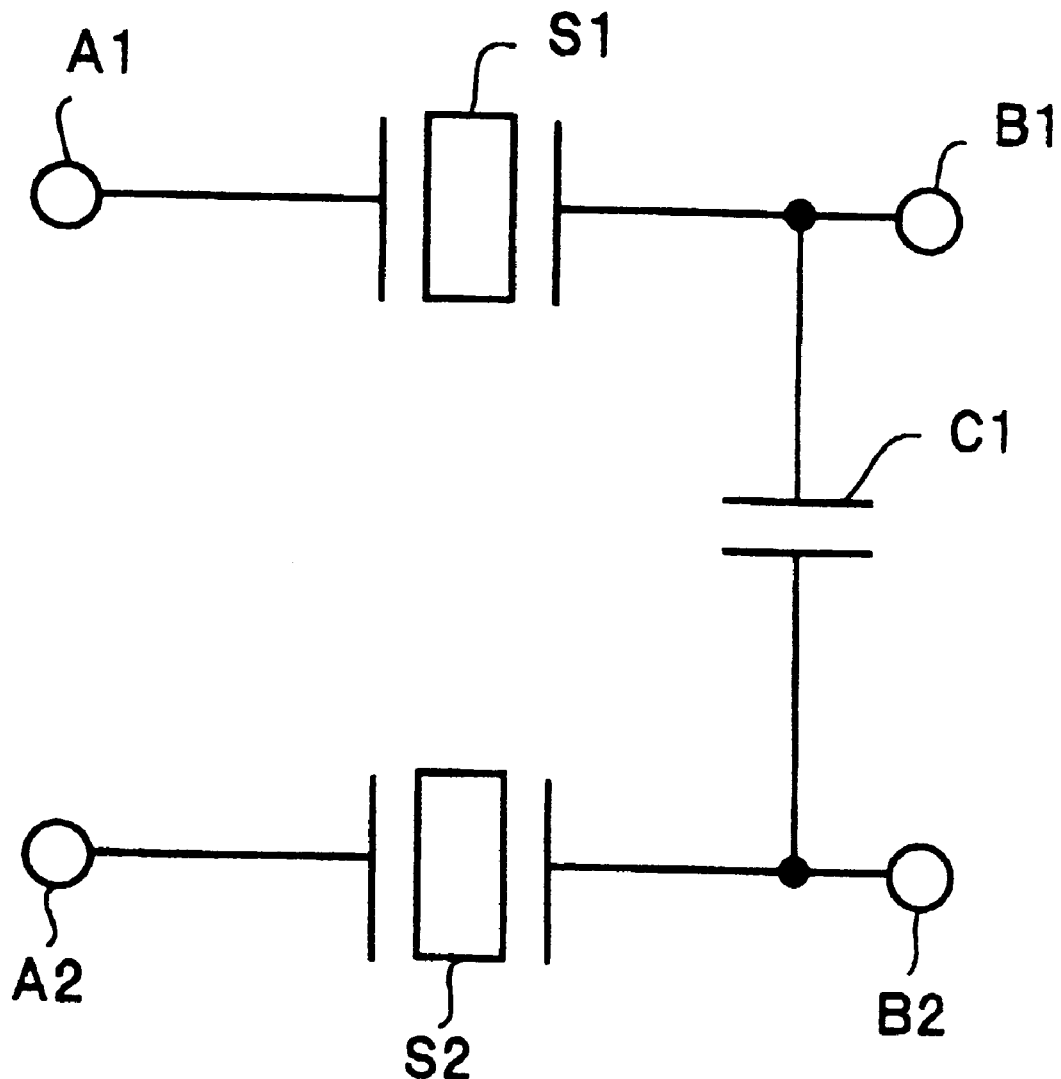
FIG. 1 is a circuit diagram of a surface acoustic wave filter according to a first preferred embodiment of the present invention.

FIG. 1 is the circuit diagram of a surface acoustic wave filter according to a first preferred embodiment of the present invention. The surface acoustic wave filter preferably includes input-side balanced signal terminals A1 and A2 that are connected to an external balanced circuit, and output-side balanced signal terminals B1 and B2 which are connected to an external balanced circuit.

A first signal line which connects the input-side balanced signal terminal A1 and the output-terminal balanced signal terminal B1 defines a first series arm. A series arm surface acoustic wave resonator S1 is connected in series with the first series arm. Likewise, a second signal line which allows the input-side balanced signal terminal A2 and the output-terminal balanced signal terminal B2 to be connected defines a second series arm. A second series arm surface acoustic wave resonator S2 is connected in series with the second series arm.

Furthermore, a capacitance element C1 is connected to define at least one impedance element between the first signal line and the second signal line.

Figure 2:
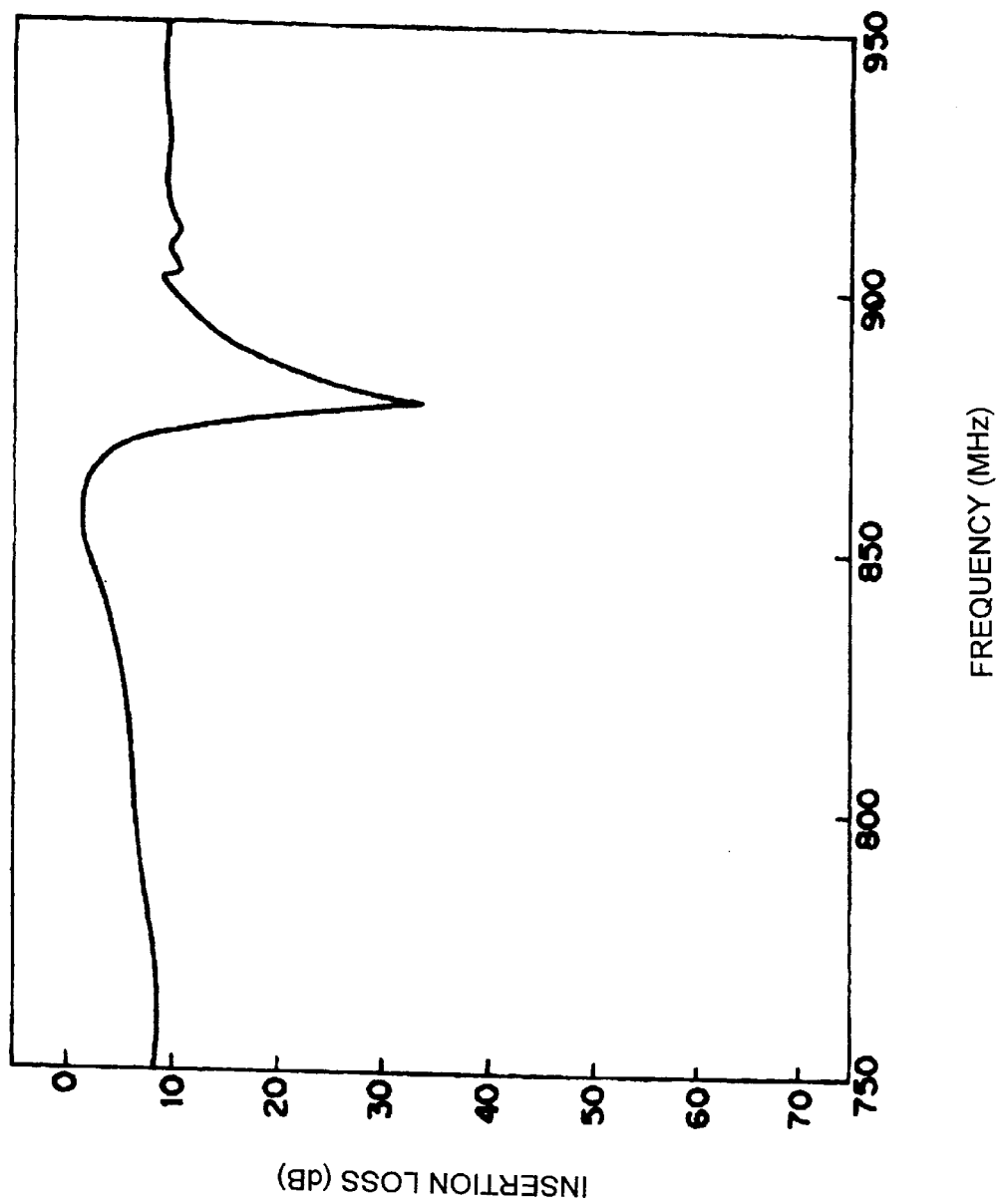
FIG. 2 is a diagram showing one example of filtering characteristics of the first preferred embodiment shown in FIG. 1.

FIG. 2 shows an example filtering characteristics of the surface acoustic wave filter according to the first preferred embodiment. As shown in FIG. 2, a surface acoustic wave filter is provided which has a narrow passband, has an attenuation pole on the wider-area side of the passband, and corresponds to the balanced input/output.

Figure 3:
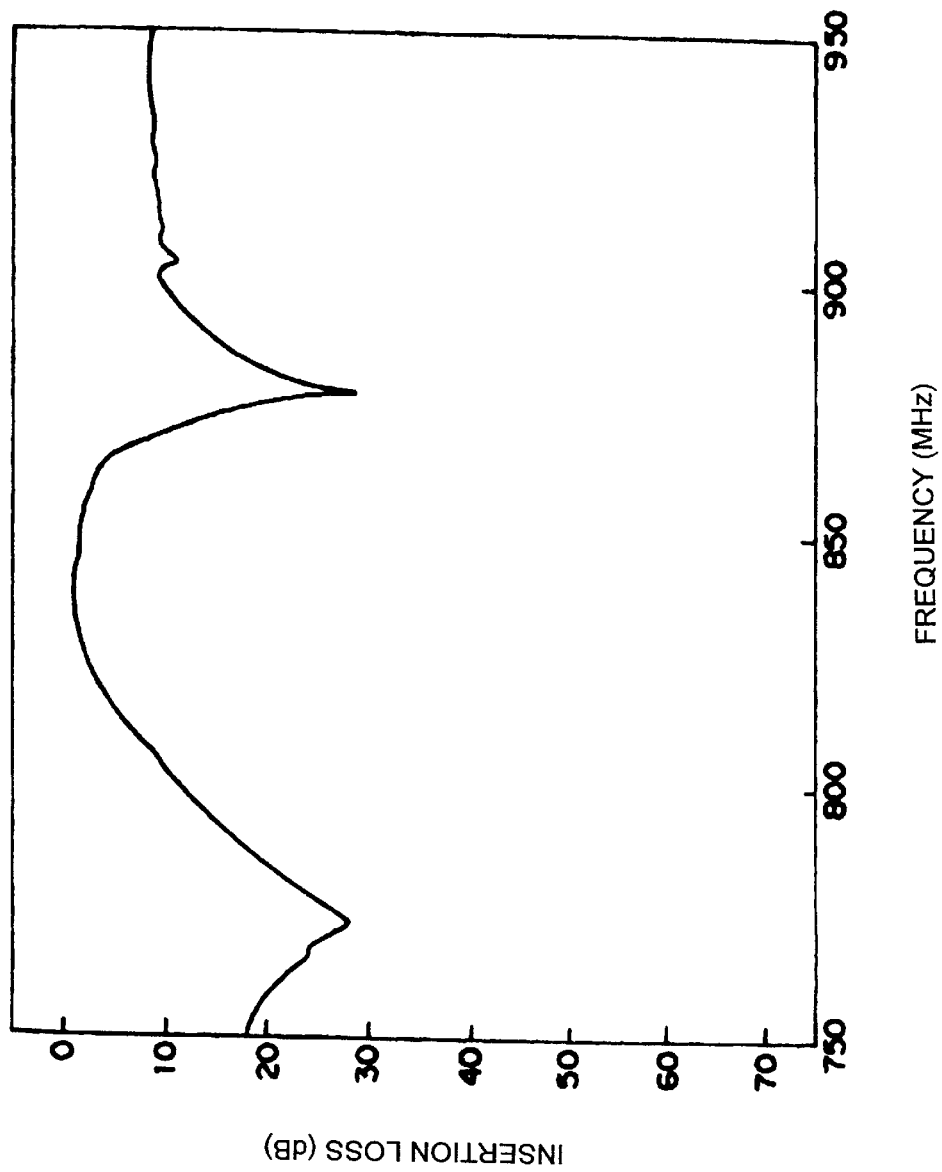
FIG. 3 is a diagram showing filtering characteristics of the first preferred embodiment shown in FIG. 1 using a resonating element instead of a capacitance element C1.

Instead of the above capacitance element C1, by using, for example, an LC resonating element as the impedance element, filtering characteristics shown in FIG. 3 are obtained. In this case, the resonating element may be constructed using a combination of an inductance element and the capacitance element, that is, using an LC resonating element.

Figure 4:
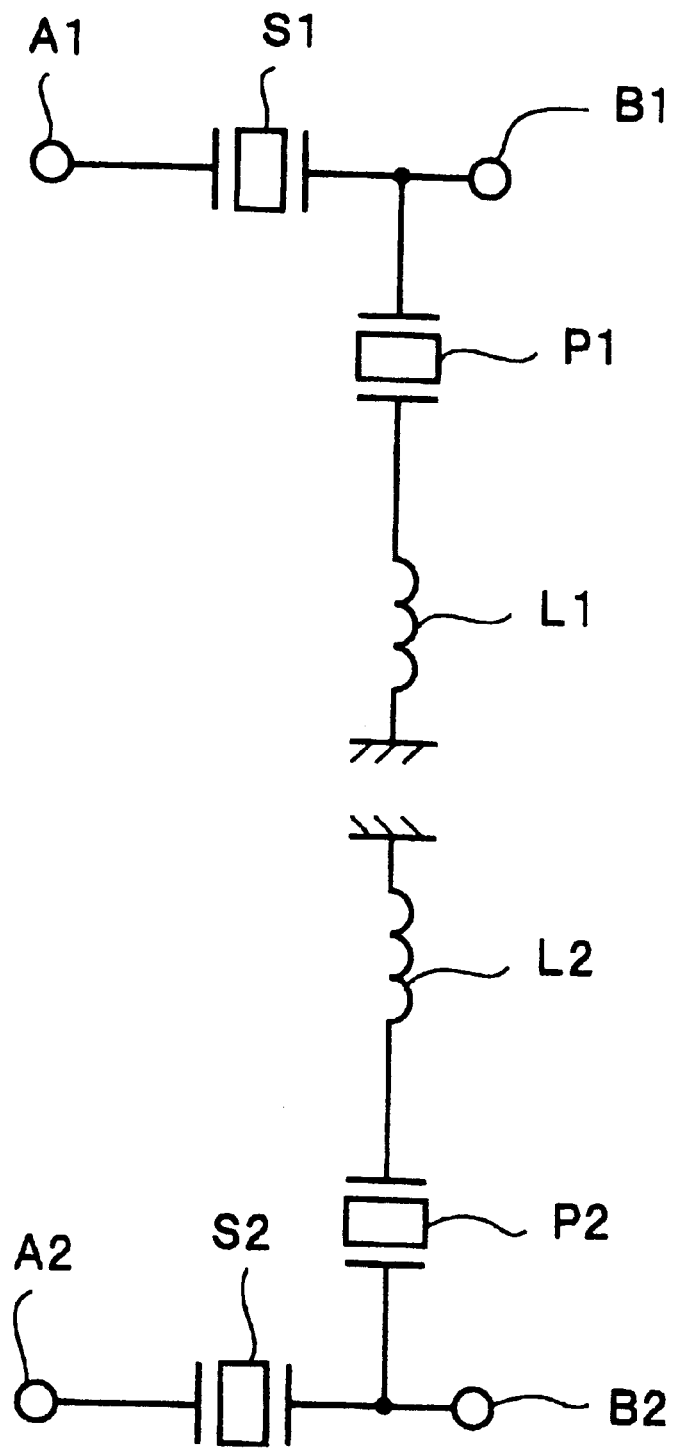
FIG. 4 is a circuit diagram of a surface acoustic wave filter according to a second preferred embodiment of the present invention.

FIG. 4 shows the circuit diagram of a surface acoustic wave filter according to a second preferred embodiment of the present invention. The surface acoustic wave filter according to the second preferred embodiment differs from the surface acoustic wave filter according to the first preferred embodiment in the construction of a parallel arm thereof. That is, third surface acoustic wave resonators P1 and P2 are led from the first signal line and the second signal lines, respectively. Terminals of these third surface acoustic wave resonators P1 and P2 which are not connected to the first signal line or the second signal line are grounded via inductance elements L1 and L2, respectively, functioning as the impedance elements. That is, the two third surface acoustic wave resonators P1 and P2 are connected via the ground potential, which defines one parallel arm.

In the second preferred embodiment, the one third surface acoustic wave resonator P1 is led from the first signal line and the one third surface acoustic wave resonator P2 is led from the second signal line. However, a plurality of the third surface acoustic wave resonators may be led from the signal lines.

Alternatively, the inductance elements L1 and L2 which function as the impedance elements may be omitted.

As is obvious from FIG. 4, since the above-described third surface acoustic wave resonators P1 and P2 are connected in series between the corresponding first and second signal lines and the ground potential, they define parallel arm resonators. They are constructed such that this surface acoustic wave resonator P1 and the surface acoustic wave resonator P2 have the same construction and the anti-resonant frequencies thereof each substantially corresponds to the resonant frequency of the series arm surface acoustic wave resonator S1.

When one of the terminals of each of the third surface acoustic wave resonators P1 and P2 is not directly grounded, the electrode capacitance ratio of the third surface acoustic wave resonators P1 and P2 can be any value. When one of the terminals of each of the third surface acoustic wave resonators P1 and P2 is grounded, the electrode capacitance ratio of the third surface acoustic wave resonators P1 and P2 are preferably approximately 1.4 or less. Here, the above-described electrode capacitance ratio is a ratio in which one of the surface acoustic wave resonators P1 and P2 having a smaller electrode capacitance is a denominator and one of them having a greater value is a numerator.

Generally, it is desirable that the phase difference of the output signal of the balanced input/output surface acoustic wave filter be approximately 180±20°.

When the above electrode capacitance ratio of the surface acoustic wave resonators P1 and P2 deviates from a value of 1, the balance with respect to the ground potential is not maintained, which causes the phase difference to be deviated from 180°. When the above electrode capacitance ratio is varied from about 1 to about 2, the deviation in phase difference from 180° is examined. The result of the examination is shown in FIG. 5.

Figure 5:
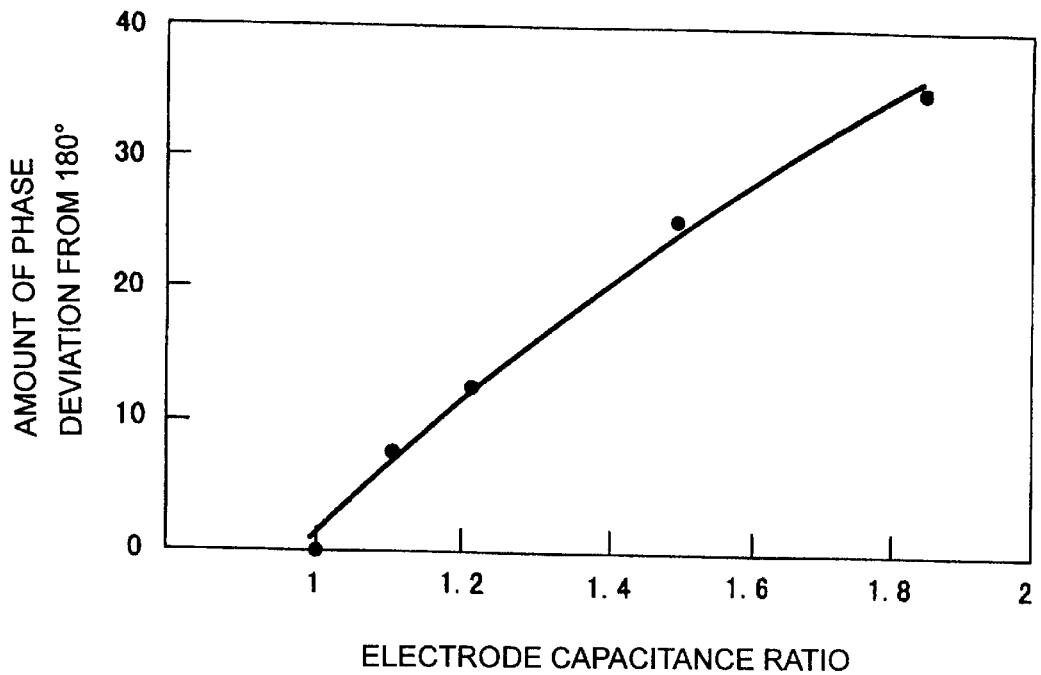
FIG. 5 is a diagram showing the relationship between the electrode capacitance ratio of third surface acoustic wave resonators and phase deviation in the second preferred embodiment.

In FIG. 5, the abscissa axis represents the electrode capacitance ratio and the ordinate axis represents the phase deviation from 180°. As is obvious from FIG. 5, when the electrode capacitance ratio is at least approximately 1.4, the phase deviation is at least approximately 20°. Therefore, when the surface acoustic wave resonators P1 and P2 are provided, it is desirable that the electrode capacitance ratio thereof be approximately 1.4 or less.

In the second preferred embodiment, the inductance elements L1 and L2 are preferably defined by the impedance elements. Alternatively, a capacitance element or a resonating element may be used.

In the surface acoustic wave filter according to the second preferred embodiment, due to the uniqueness of this construction, preferable filtering characteristics are obtained as compared with a conventional unbalanced ladder surface acoustic wave filter. According to the above Japanese Unexamined Patent Application Publication No. 6-69750, the relationship between the electrode capacitance of the series arm resonator and that of the parallel arm resonator is restricted by the input/output impedance and the operating frequency. Particularly, when influences due to the parasitic capacitance included in a package and other influences are ignored, the relationship between the above electrode capacitances is expressed using the below-described expression 1. In the expression 1, $\omega_o$ is the angular frequency with respect to the center frequency $f_o$ of the filter, $C_{OP}$ is the electrode capacitance of the parallel arm resonator, $C_{OS}$ is the electrode capacitance of the series arm resonator, and R is the input/output impedance.

$$1/\omega_o^2 \times C_{OP} \times C_{OS} = R_o^2 \qquad \text{(expression 1)}$$

Here, with respect to the balanced circuit and the unbalanced circuit, the optimum values of the electrode capacitances thereof are determined when the same input/output impedance R1 is applied thereto.

Figure 6:
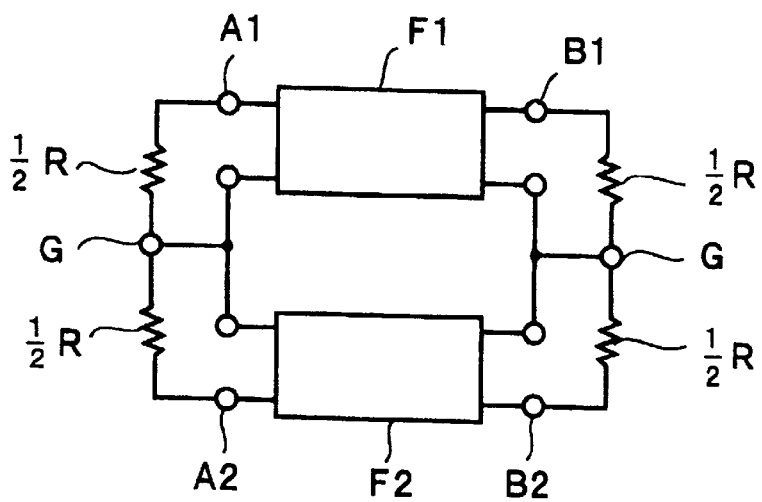
FIG. 6 is a circuit diagram illustrating a measuring system for measuring filtering characteristics of the surface acoustic wave filter according to the second preferred embodiment of the present invention.

FIG. 6 is a diagram schematically showing the circuit construction of the surface acoustic wave filter according to the second preferred embodiment when it operates in a balanced circuit. The impedance R between the input-side balanced signal terminals A1 and A2 is considered to be equally divided into both sides of a virtual neutral point G between the input-side balanced signal terminals A1 and A2 when the virtual neutral point G is set as a reference point.

That is, the impedances between the input-side balanced signal terminals A1 and A2 and the virtual neutral point G are each (½) R. Likewise, the impedance R between the output-side balanced signal terminals B1 and B2, is considered to be equally divided into both sides of the virtual neutral point as well.

Furthermore, concerning the surface acoustic wave filter, when the virtual neutral point G is set as the reference, the surface acoustic wave filter is considered to be divided into a surface acoustic wave filter unit F1 and a surface acoustic wave filter unit F2. In this case, the surface acoustic wave filter units F1 and F2 are designed to operate corresponding to an input/output impedance of (½) R. This achieves a balanced filter which operates such that is has an impedance of R when it is balanced.

Figure 7A:
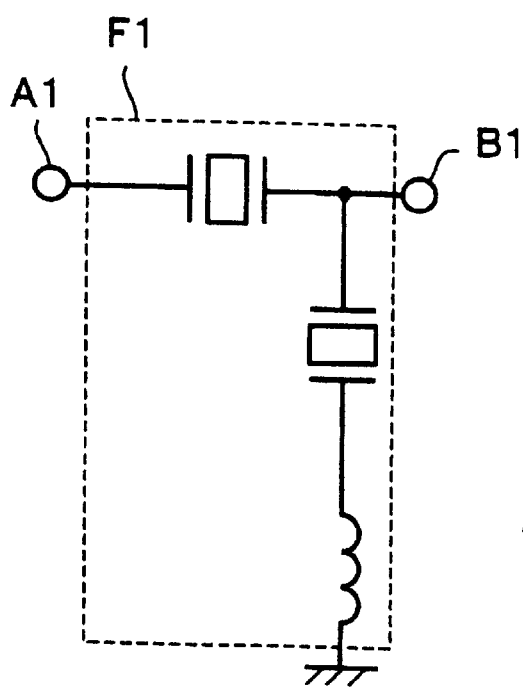
FIGS. 7A and 7B are circuit diagrams rewritten with other expressions.
Figure 7B:
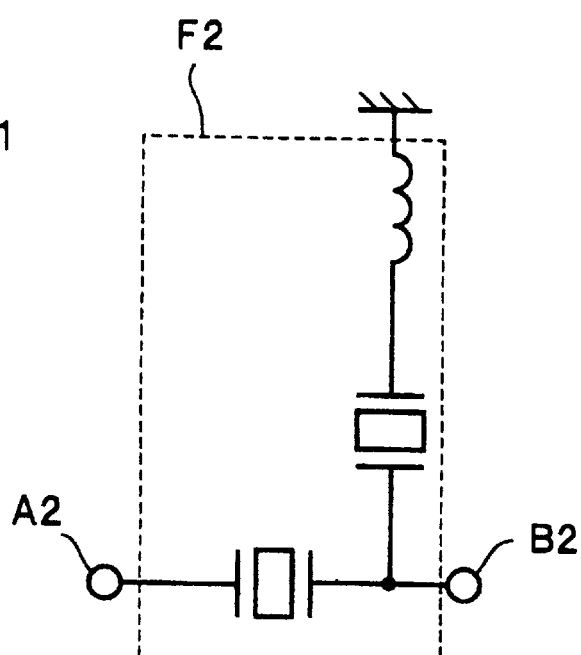

That is, as shown in FIG. 7, the surface acoustic wave filter according to the second preferred embodiment shown in FIG. 4 is considered to be divided into the two surface acoustic wave filter units F1 and F2. In this case, it is understood that the surface acoustic wave filter units F1 and F2 operate having an impedance which is half of the input/output impedance R1.

Therefore, according to the above-described expression 1, when the product of the electrode capacitance $C_{s1}$ of the series arm resonator S1 and the electrode capacitance $C_{p1}$ of the parallel arm resonator P1 is four times the product obtained in a case in which the surface acoustic wave filter is operated in the unbalanced circuit, it is understood that the electrode capacitances have optimal values.

Figure 8A:
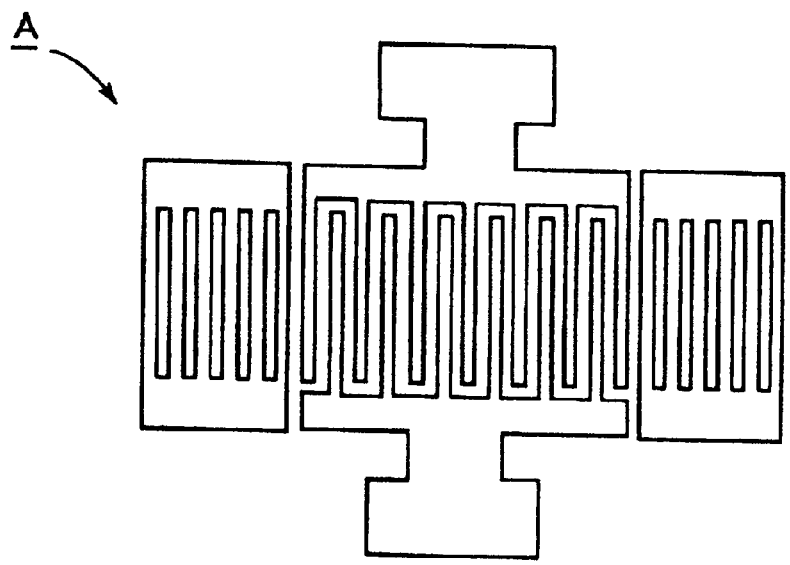
FIGS. 8A and 8B are plan views illustrating the surface acoustic wave resonator used in the surface acoustic wave filter according to the second preferred embodiment of the present invention.
Figure 8B:
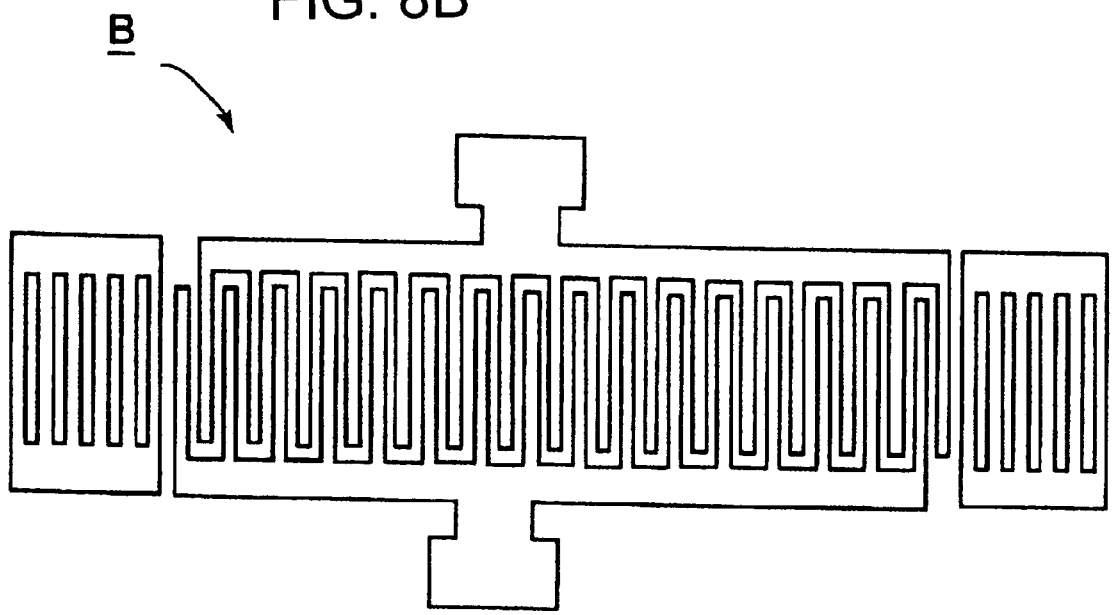

When the impedance element is added to the surface acoustic wave resonator, due to the electrode capacitance of the surface acoustic wave resonator, influences caused by addition of the impedance element are altered. The influences caused by the addition of the impedance element are described using a surface acoustic wave resonator A and a surface acoustic wave resonator B shown in FIGS. 8A and 8B, respectively. The surface acoustic wave resonator A and the surface acoustic wave resonator B have different electrode capacitances.

Each of the acoustic surface acoustic wave resonators A and B is preferably a one-port surface acoustic wave resonator which has an IDT electrode in the approximate middle thereof and grating reflectors on both sides of the IDT.

The IDT electrode of the surface acoustic wave resonator A preferably includes 50 electrode finger pairs and the reflector thereof preferably includes 100 electrode fingers in which the electrode finger crossover width of the IDT electrode is preferably about 100 μm and the electrode finger pitch is preferably about 2 μm. The IDT electrode of the surface acoustic wave resonator B includes 100 electrode finger pairs and the reflector thereof includes 100 electrode fingers in which the electrode finger crossover width is preferably about 100 μm and the electrode finger pitch is preferably about 2 μm.

The electrode capacitance is in proportion to the product of the number of electrode finger pairs and the crossover width. Therefore, the electrode capacitance of the surface acoustic wave resonator A is half the electrode capacitance of the surface acoustic wave resonator B.

Figure 9:
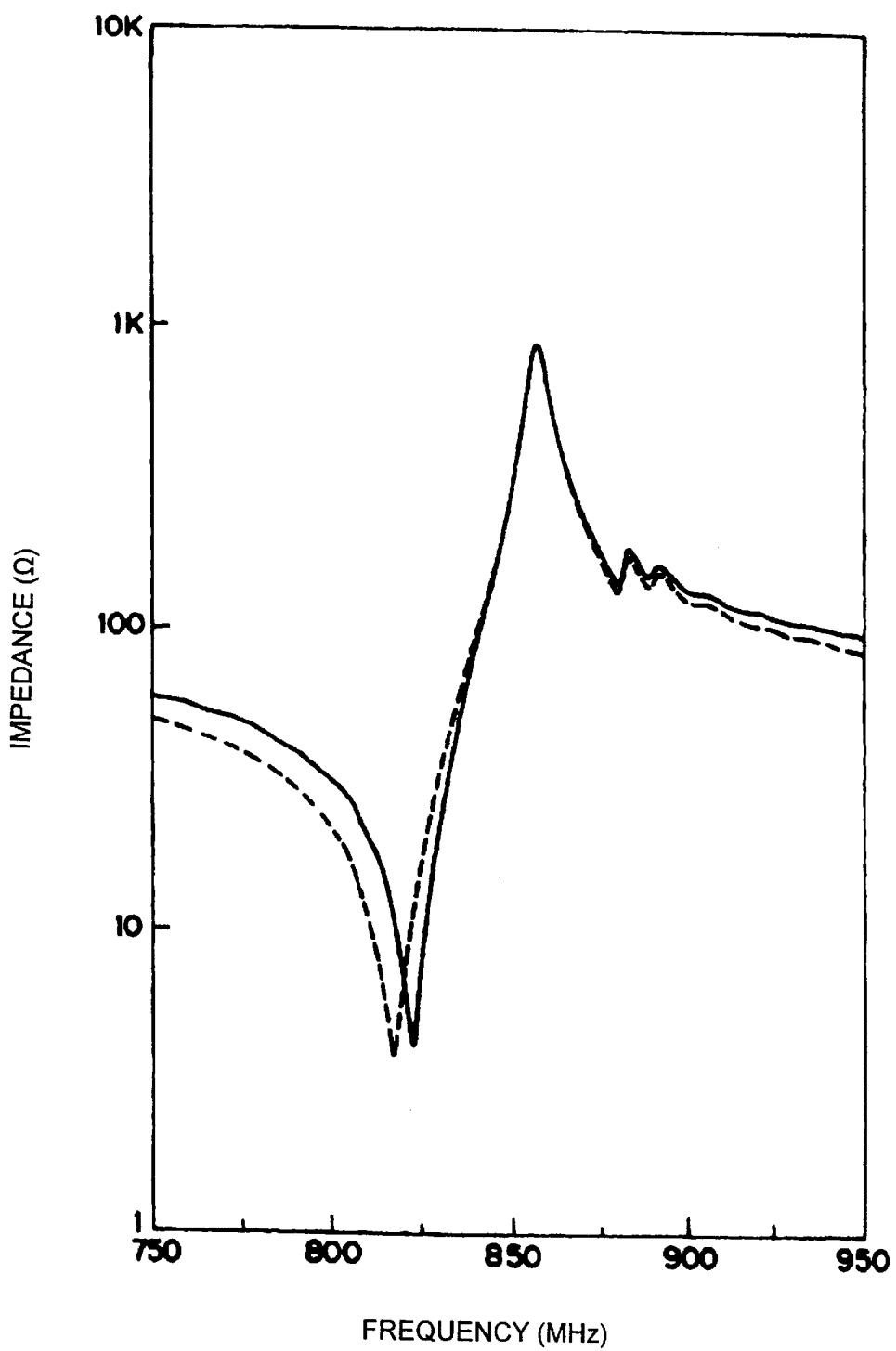
FIG. 9 is a diagram showing impedance characteristics when an inductance is added to a surface acoustic wave resonator A shown in FIG. 8A and when it is not.
Figure 10:
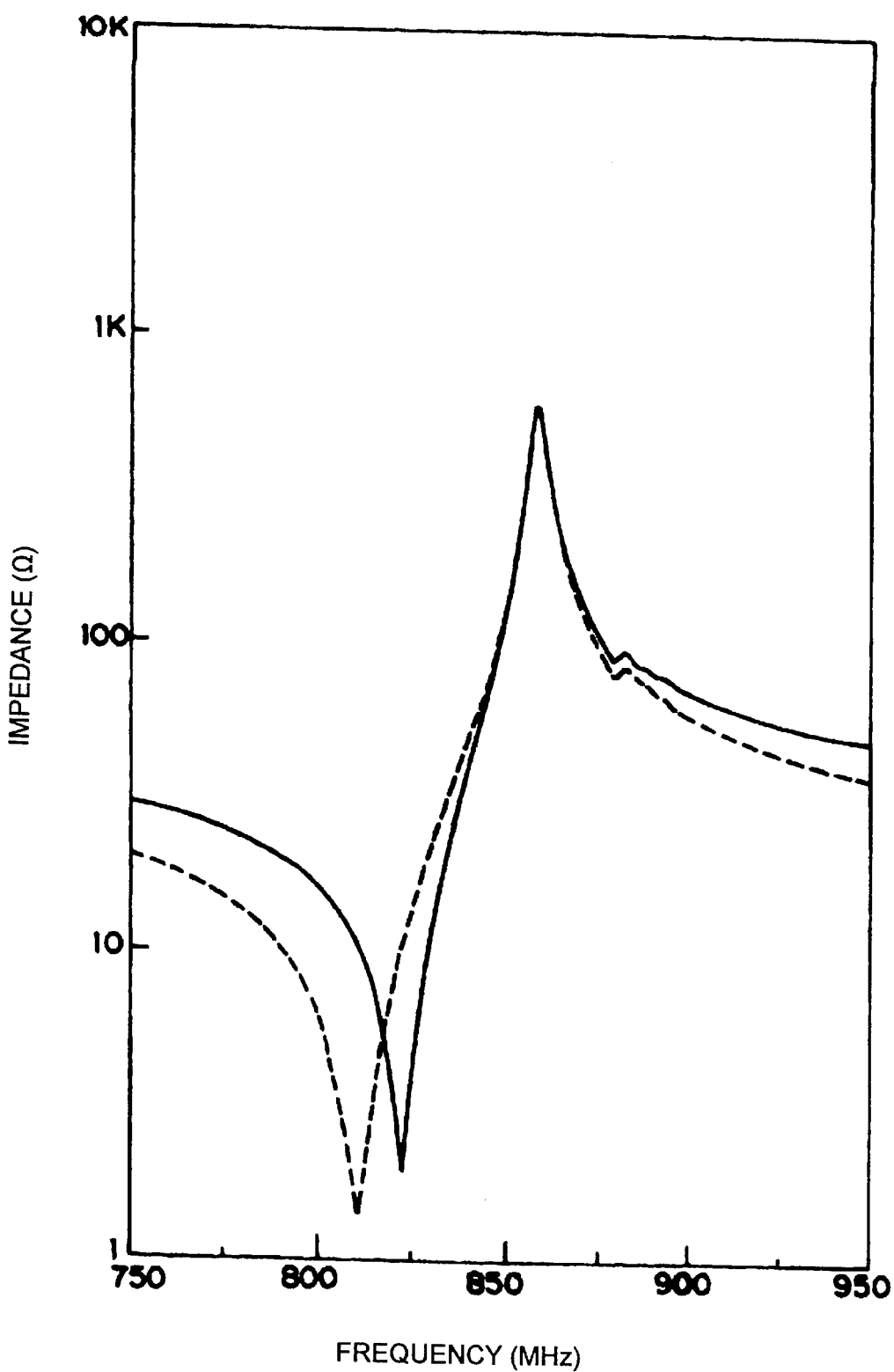
FIG. 10 is a diagram showing impedance characteristics when an inductance is added to a surface acoustic wave resonator B shown in FIG. 8B and when it is not.

FIGS. 9 and 10 show impedance characteristics of the surface acoustic wave resonators A and B, respectively, where inductances of about 2 nH are each connected in series with the surface acoustic wave resonators.

In FIG. 9, the solid line shows impedance characteristics of the surface acoustic wave resonator A where it is not connected to the inductance, and the dashed line shows impedance characteristics thereof where it is connected to the inductance. In FIG. 10, the solid line shows impedance characteristics of the surface acoustic wave resonator B where it is not connected to the inductance, and the dashed line shows impedance characteristics thereof where it is connected to the inductance.

As is obvious from the comparisons of the characteristics shown in FIGS. 9 and 10, when variations in the resonant frequencies of the surface acoustic wave resonators are compared where each of them is connected to the same inductance, the surface acoustic wave resonator A having an electrode capacitance that is half that of the surface acoustic wave resonator B has smaller variation, which is approximately half the variation in the resonator B.

Therefore, when the resonators are connected to the same inductance, influences due to the resonators increases as the electrode capacitance thereof increases. This is advantageous where expansion of the bandwidth is desired.

When the surface acoustic wave resonator is connected in series with the capacitance element, the resonant frequency thereof increases. However, influences caused by the connection of the capacitance element are similar to the connection of the inductance. Therefore, as the electrode capacitance increases, the expansion or reduction of the bandwidth is facilitated.

As described in U.S. Pat. No. 5,499,003, when the parallel arm resonator is directly connected to the series arm resonator, filtering characteristics of the balanced surface acoustic wave filter deteriorate as compared with those of the unbalanced surface acoustic wave filter. However, in the surface acoustic wave filter according to the second preferred embodiment in which the two third surface acoustic wave resonators P1 and P2 are provided in one parallel arm and the inductance elements L1 and L2 are added, not only filtering characteristics corresponding to the balanced circuit, but also greatly improved filtering characteristics as compared with those of the conventional unbalanced surface acoustic wave filter are achieved. That is, wide bandwidth and high attenuation filtering characteristics are achieved.

Figure 11:
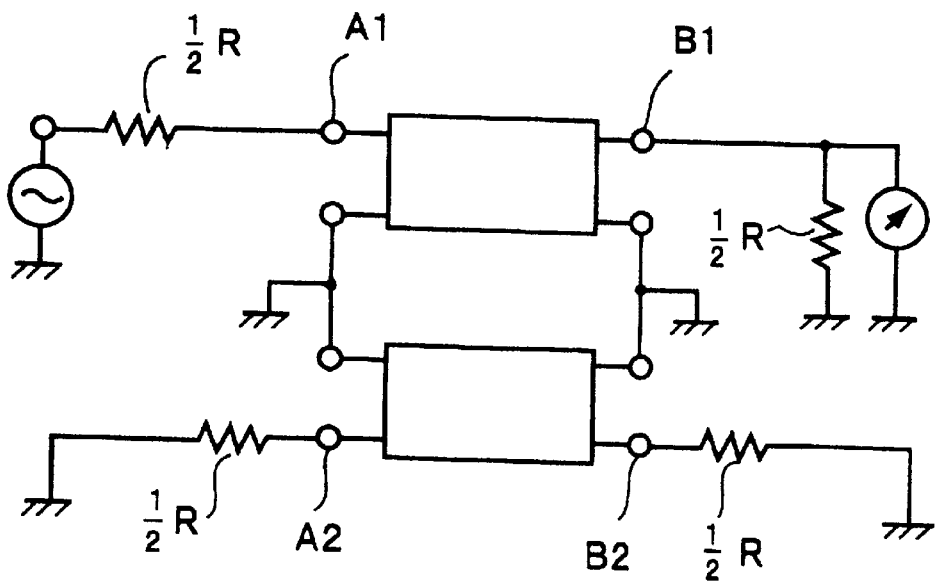
FIG. 11 is a circuit diagram illustrating a measuring system that measures filtering characteristics of the surface acoustic wave filter using a balanced circuit system measuring device.

Furthermore, electrical characteristics of the surface acoustic wave filter according to the second preferred embodiment can be measured using the unbalanced circuit. FIG. 11 shows the circuit construction where filtering characteristics of the surface acoustic wave filter according to the second preferred embodiment are measured using a measuring device including the unbalanced circuit.

As shown in FIG. 11, the input-side balanced signal terminal A1 and the output-side balanced signal terminal B1 are each terminated with impedance (½)R which is half the impedance with which the surface acoustic wave filter operates. By causing the input-side balanced signal terminal A1 and the output-side balanced signal terminal B1 to function as an input terminal and as an output terminal, respectively, the filtering characteristics of the surface acoustic wave filter having an impedance of (½) R terminated are measured using the unbalanced circuit.

Likewise, the input-side balanced signal terminal A2 and the output-side balanced terminal B2 are terminated with impedance (½) R. By causing the input-side balanced signal terminal A2 and the output-side balanced signal terminal B2 to function as an input terminal and as an output terminal, respectively, the filtering characteristics of the surface acoustic wave filter having an impedance of (½) R terminated are measured using the unbalanced circuit.

From the results of the above measurements, operations of the surface acoustic wave filter in the balanced state are measured and filtering characteristics thereof are examined using the unbalanced circuit.

Each surface acoustic wave resonator is designed to be symmetrical when observed from the ground terminal. By only measuring filtering characteristics of one side of the circuit, this design enables operations of the other side of the filter unit to be estimated. Accordingly, measurement time and costs of the filtering characteristics are greatly reduced. In addition, when the surface acoustic wave resonator operates using the balanced circuit, the balance is greatly increased.

The present invention is not limited to the surface acoustic wave filters according to the above first and second preferred embodiments. When an actual surface acoustic wave filter is constructed, by appropriately combining these basic combinations or by connecting a plurality of stages, a variety of surface acoustic wave filters can be constructed. For example, an impedance element added to each parallel arm may not necessarily be identical. In some parallel arms, impedance elements may not be added.

Figure 12:
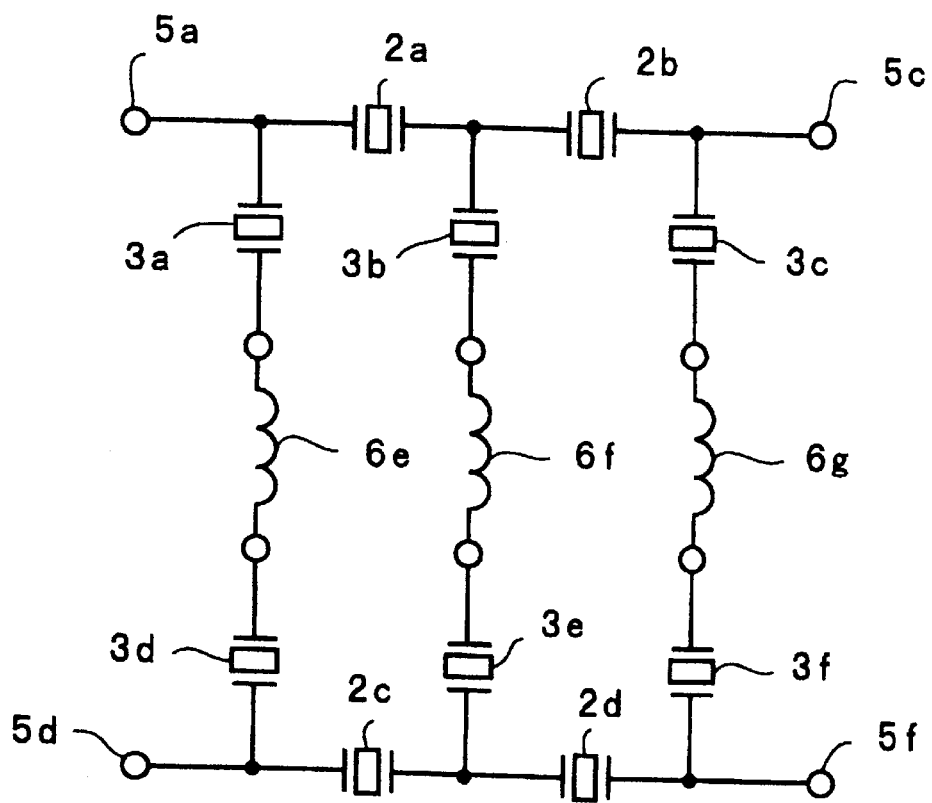
FIG. 12 is a diagram showing the circuit of a surface acoustic wave filter according to the first preferred embodiment of the present invention.
Figure 13:
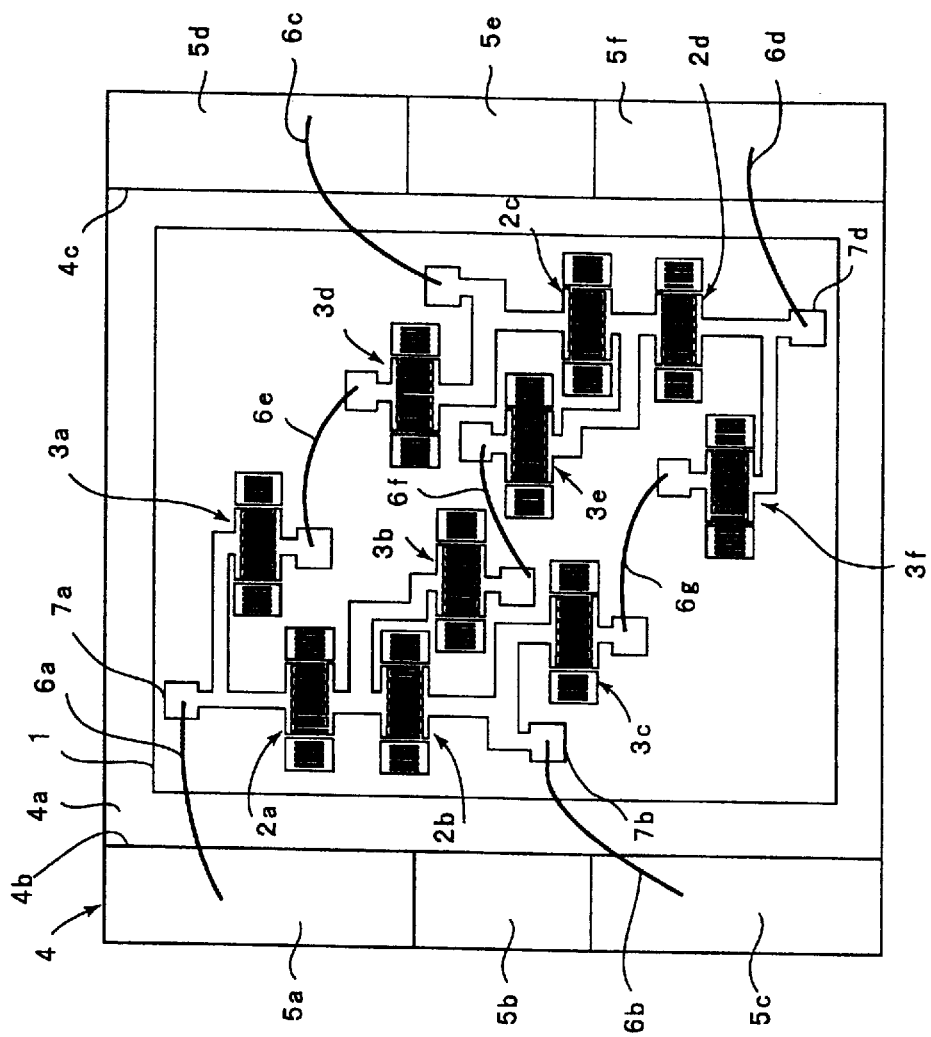
FIG. 13 is a schematic plan view illustrating the construction of the first preferred embodiment of the present invention.

FIG. 12 is a circuit diagram of the surface acoustic wave filter according to the first preferred embodiment of the present invention and FIG. 13 is a plan view schematically showing the surface acoustic wave filter element mounted in a package.

In the present invention, a substantially rectangular plate LiTaO₃ substrate is preferably used to define a piezoelectric substrate 1, although other suitable substrates may be used. In the piezoelectric substrate 1, four series arm resonators 2a to 2d and six parallel arm resonators 3a to 3f are provided. The series arm resonators 2a and 2b represent first series arm resonators, respectively, and the series arm resonators 2c and 2d represent second series arm resonators, respectively. Each of the parallel arm resonators 3a to 3f represents a third resonator. The series arm resonators 2a to 2d and the parallel arm resonators 3a to 3f are the above-described one-port surface acoustic wave resonators.

The four series arm resonators 2a to 4d and the six parallel arm resonators 3a to 3f are electrically connected, such that a filter circuit having the ladder circuit construction is obtained.

In a package 4, a concave portion 4a is provided for storing a surface acoustic wave filter element in which the series arm resonators 2a to 2d and the parallel arm resonators 3a to 3d are provided on the piezoelectric substrate 1. Projections 4b and 4c are provided on both sides of the concave portion 4a. On the top surface of the projections 4b and 4c, input/output balanced signal terminals 5a, 5c, 5d, and 5f are provided. A terminal 5b is provided between the balanced signal terminals 5a and 5c. On the projection 4c, a terminal 5e is provided between the balanced signal terminals 5d and 5f.

In the present preferred embodiment, the balanced signal terminal 5a corresponds to the input-side balanced signal terminal A1 and the balanced signal terminal 5d corresponds to the input-side balanced signal terminal A2. The balanced signal terminal 5c corresponds to the output-side balanced signal terminal B1 and the balanced signal terminal 5f corresponds to the output-side balanced signal terminal B2.

As is obvious from FIG. 13, the balanced signal terminal 5a is connected to an electrode pad 7a via a bonding wire 6a. The electrode pad 7a is connected to one terminal of the series arm resonator 2a and one terminal of the parallel arm resonator 3a. The terminal of the series arm resonator 2a which is on the side not connected to the electrode pad 7a is connected to one terminal of the series arm resonator 2b and one terminal of the parallel arm resonator 3b.

The other terminal of the series arm resonator 2b is connected to an electrode pad 7b and one terminal of the parallel arm resonator 3c. The electrode pad 7b is connected via a bonding wire 6b to the balanced signal terminal 5c corresponding to the output-side balanced signal B1.

Accordingly, the two series arm resonators 2a and 2b are connected via the bonding wires 6a and 6b in series between the input-side balanced signal terminal 5a and the output-side balanced signal terminal 5c. That is, the two first series arm resonators 2a and 2b are connected in series with the first signal line.

Likewise, the balanced signal terminal 5d corresponding to the input-side balanced signal terminal A2 is connected to an electrode pad 7c via the bonding wire 6c. The electrode pad 7c is connected to one terminal of the series arm resonator 2c and that of the parallel arm resonator 3d. The other terminal of the series arm resonator 2c is connected to one terminal of the series arm resonator 2d and that of the parallel arm resonator 3e. The other terminal of the series arm resonator 2d is connected to an electrode pad 7d. The electrode pad 7d is connected via a bonding wire 6d to the balanced signal terminal 5f, i.e. the output-side balanced signal terminal B2. Accordingly, in the second signal line between the balanced signal terminals 5d and 5f, the two series arm resonators 2c and 2d are connected via the bonding wires 6c and 6d.

On the other hand, the terminals of the parallel arm resonators 3a and 3d which are not connected to the first signal line or the second signal line, respectively, are connected using a bonding wire 6e. Therefore, one parallel arm having the parallel arm resonators 3a and 3d is provided as the two third surface acoustic wave resonators between the first signal line and the second signal line.

Likewise, the terminals of the parallel arm resonators 3b and 3e that are not connected to the first signal line or the second signal line, respectively, are connected via a bonding wire 6f.

Furthermore, the terminals of the parallel arm resonators 3c and 3f that are not connected to the first signal line or the second signal line, respectively, are connected via a bonding wire 6g.

Therefore, a parallel arm having the parallel arm resonators 3b and 3e and a parallel arm having the parallel arm resonators 3c and 3f are provided between the first signal line and the second signal line.

The following Table 1 shows the construction of each of series arm resonators 2a to 2d and parallel arm resonators 3a to 3f.

| RESONATOR NO. | IDT PAIR NO. | REFLECTOR NO. | PITCH (μm) | CROSSOVER WIDTH (μm) |
|---|---|---|---|---|
| 2a | 105 | 80 | 4.644 | 161 |
| 2b | 105 | 80 | 4.644 | 161 |
| 2c | 105 | 80 | 4.644 | 161 |
| 2d | 105 | 80 | 4.644 | 161 |
| 3a | 120 | 60 | 4.850 | 120 |
| 3b | 160 | 60 | 4.855 | 180 |
| 3c | 120 | 60 | 4.850 | 120 |
| 3d | 120 | 60 | 4.850 | 120 |
| 3e | 160 | 60 | 4.855 | 180 |
| 3f | 120 | 60 | 4.850 | 120 |

In the present preferred embodiment, the bonding wires 6e to 6g that establish connections between corresponding parallel arm resonators are configured to have an impedance of about 1 nH.

Next, operations of the surface acoustic wave filter according to various preferred embodiments of the present invention are described.

By causing the above balanced signal terminals 5a and 5d to function as the input-side balanced signal terminals and the balanced signal terminals 5c and 5f to function as the output-side balanced signal terminals, the surface acoustic wave filter according to the present preferred embodiment operates as one having the ladder circuit construction. In this case, the two third surface acoustic wave resonators are provided as the parallel arm resonators for each parallel arm in which the inductance based on the corresponding bonding wire 6e to 6g is inserted between the corresponding two parallel arm resonators. Therefore, without spoiling the balance, wide-band filtering characteristics are obtained.

Figure 14:
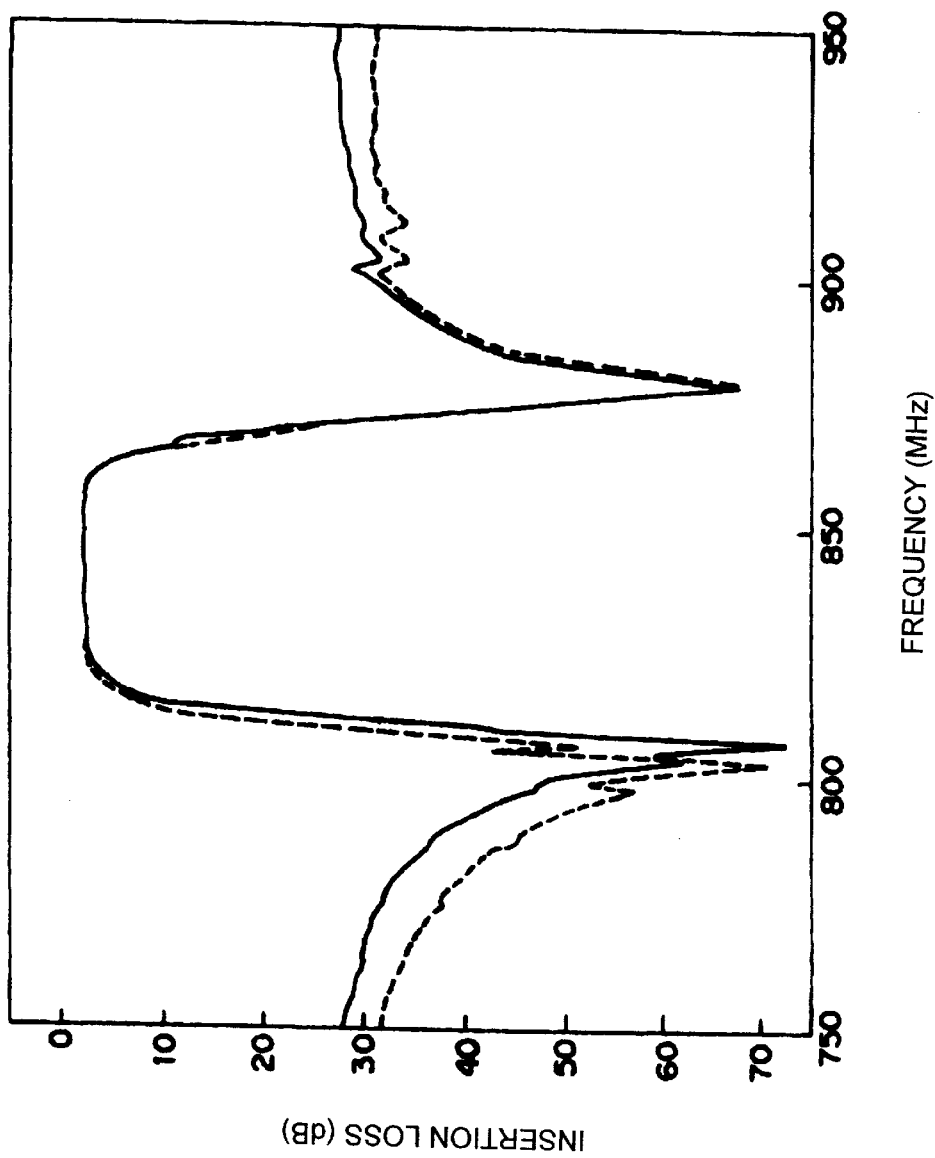
FIG. 14 is a diagram showing filtering characteristics of the surface acoustic wave filters according to the first preferred embodiment of the present invention and a related art device.

Using a measuring device, shown in FIG. 11, which uses the balanced circuit, for filtering characteristics of the surface acoustic wave filter, the filtering characteristics of the surface acoustic wave filter according to the present preferred embodiment are measured. The results of this measurement are shown with the dashed line in FIG. 14. The solid line in FIG. 14 represents characteristics of the surface acoustic wave filter having an equivalent construction pursuant to U.S. Pat. No. 5,499,003. FIG. 14 shows that the present preferred embodiment enables the passband width to be greatly increased and the attenuation to be greatly increased.

Figure 15:
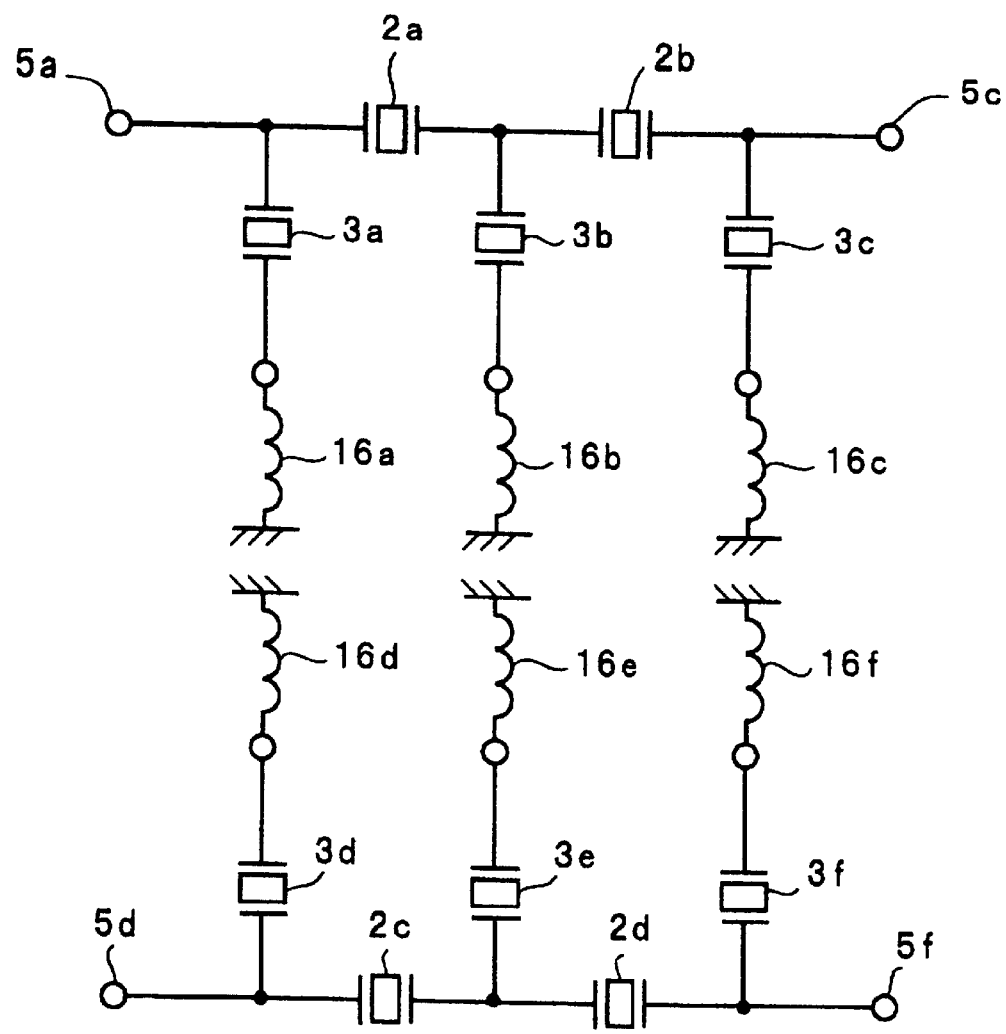
FIG. 15 is a diagram showing the circuit construction of a surface acoustic wave filter according to the second preferred embodiment of the present invention.
Figure 16:
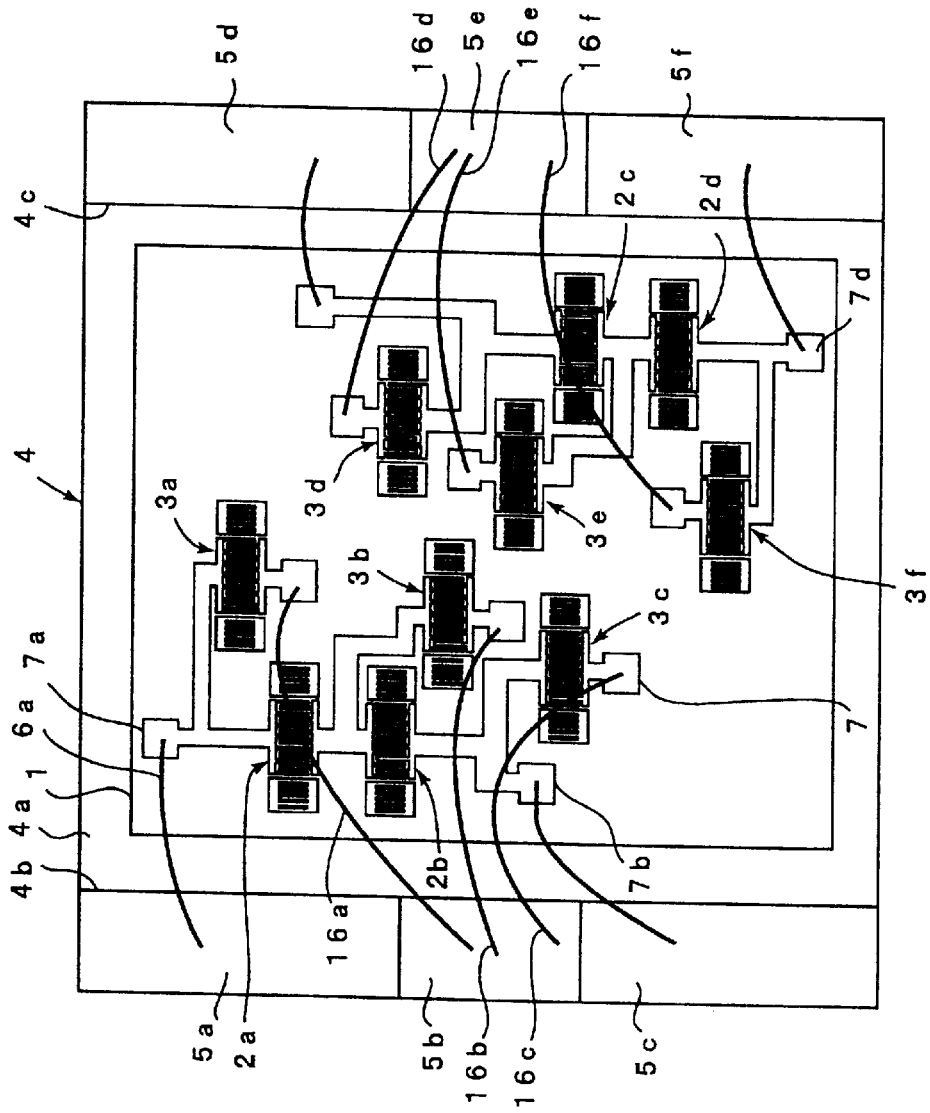
FIG. 16 is a schematic plan view illustrating the construction of the second preferred embodiment of the present invention.

FIG. 15 is a diagram showing the circuit construction of the surface acoustic wave filter according to the second preferred embodiment. FIG. 16 is a schematic plan view illustrating a surface acoustic wave filter element contained in a package in the surface acoustic wave filter according to the second preferred embodiment.

In the second preferred embodiment, elements which are identical to those in the first preferred embodiment have the same reference numerals used in the description of the first preferred embodiment, and therefore, the detailed descriptions thereof are omitted.

In the second preferred embodiment, as shown in FIG. 16, the terminals 5b and 5e are electrically connected to terminals of the parallel arm resonators 3a to 3c and terminals of the parallel arm resonators 3d to 3f via the bonding wires 16a to 16c and 16d to 16f, respectively. The terminals 5b and 5e are the terminals that are connected to the ground potential.

That is, in the second preferred embodiment, terminals of the parallel arm resonators 3a to 3f which are not connected to the corresponding first or the corresponding second signal lines are connected to the ground potential. Specifications of each of the series arm resonators 2a to 2d and the parallel arm resonators 3a to 3f are as shown in Table 1.

In the surface acoustic wave filter according to the second preferred embodiment, two parallel arm resonators which are inserted in each of the parallel arms are connected via the ground potential. For example, the parallel arm resonators 3a connected to the first signal line and the parallel arm resonator 3d connected to the second signal line are connected via the ground potential to define one parallel arm. Likewise, the parallel arm resonators 3b and 3e are connected via the ground potential to define one parallel arm. In addition, the parallel arm resonators 3c and 3f are connected via the ground potential to define one parallel arm.

The bonding wires 16a to 16c and 16d to 16f have an inductance of approximately 1 nH in the same manner as in the first preferred embodiment.

Therefore, by adding an inductance component defined by wiring in the package 4 to an inductance of about 2 nH of the two bonding wires, an inductance of approximately 2.5 nH is inserted between the two parallel arm resonators in each parallel arm.

Figure 17:
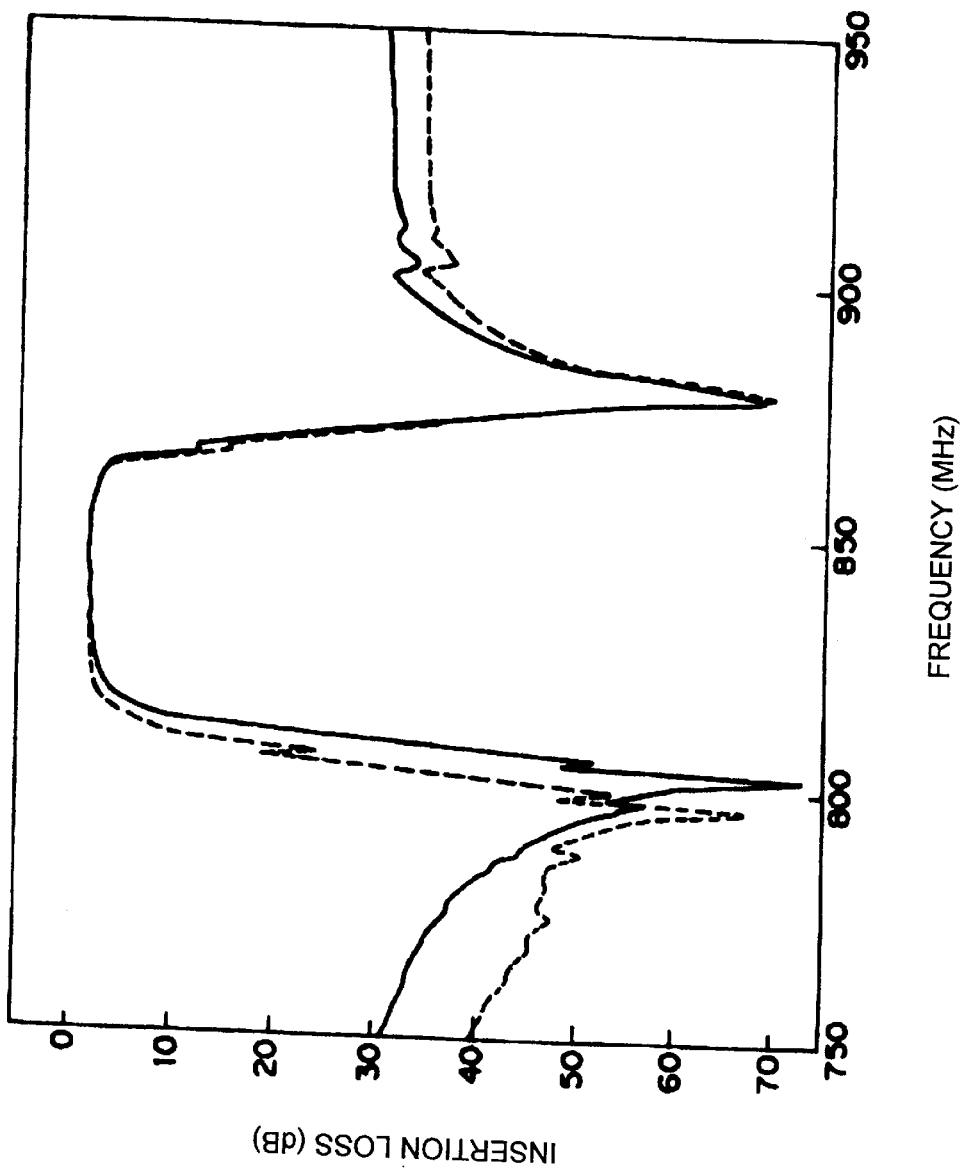
FIG. 17 is a diagram showing filtering characteristics of the surface acoustic wave filters according to the first and second preferred embodiments of the present invention.

Filtering characteristics of the surface acoustic wave filter according to the second preferred embodiment are shown with the dashed line in FIG. 17. For comparison, the filtering characteristics of the surface acoustic wave filter according to the first preferred embodiment are shown with the solid line.

As is obvious from FIG. 17, the frequency of the attenuation pole of the surface acoustic wave filter according to the second preferred embodiment is decreased as compared with those of the first preferred embodiment, which illustrates higher inductance insertion thereto.

The surface acoustic wave filter according to the second preferred embodiment is measured using the measuring system shown in FIG. 11. Since the input/output impedance of the second preferred embodiment is a 500 Ω series, it is preferable that the terminals 5b and 5d be terminated with approximately 25 Ω and the filtering characteristics be measured between the terminals 5a and 5c using the measuring circuit having 25 Ω series.

Figure 18:
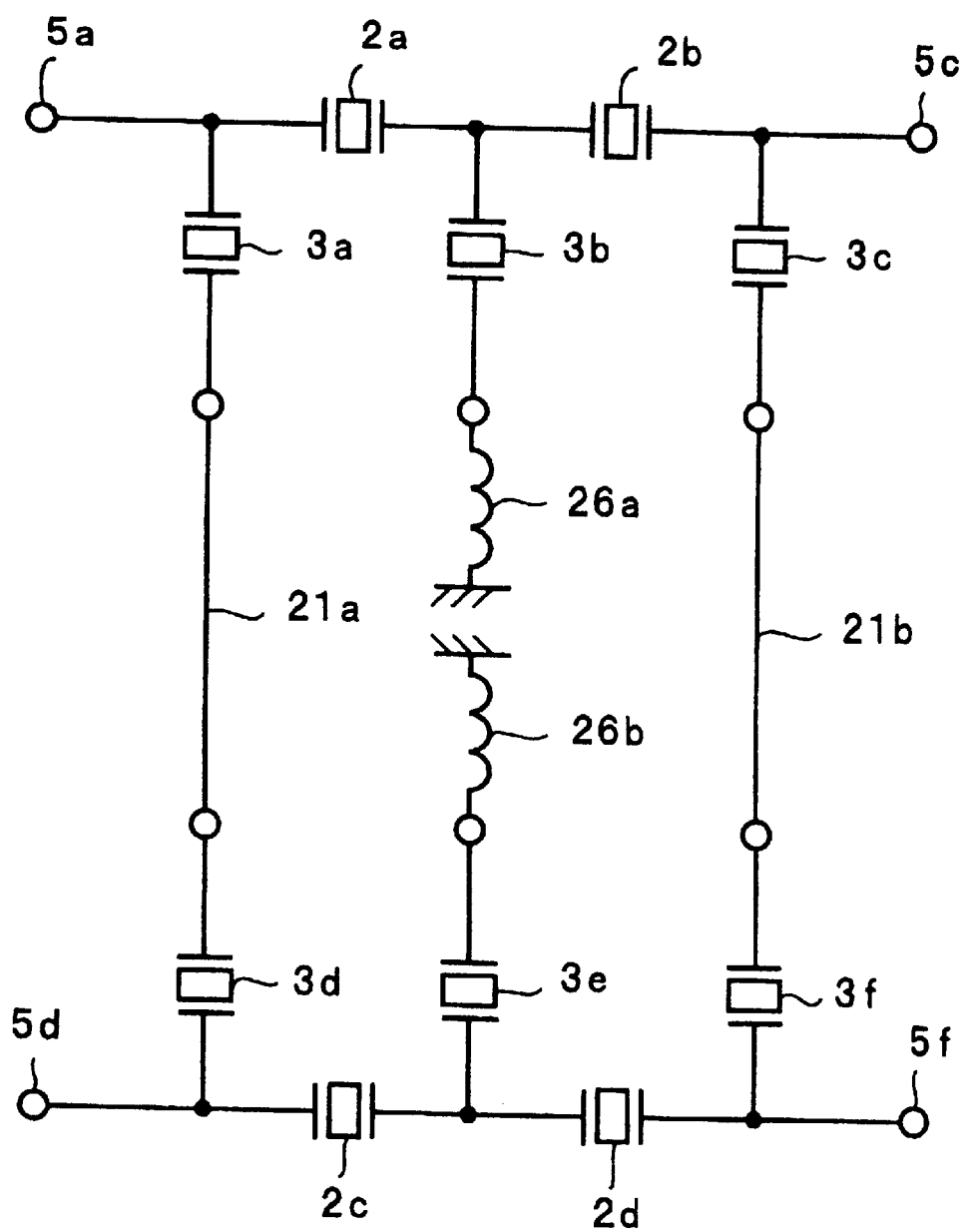
FIG. 18 is a diagram showing the circuit construction of a surface acoustic wave filter according to a third preferred embodiment of the present invention.
Figure 19:
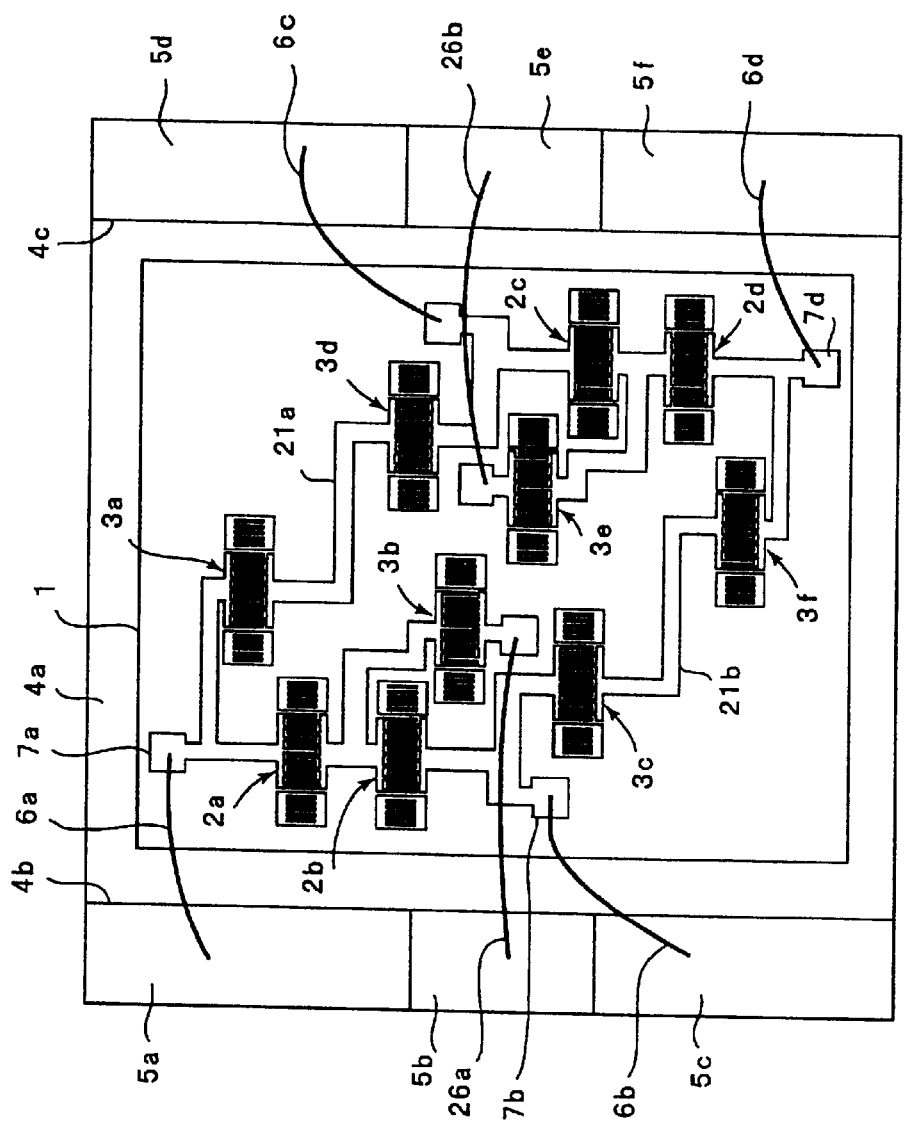
FIG. 19 is a schematic plan view illustrating the construction of the third preferred embodiment of the present invention.
Figure 20:
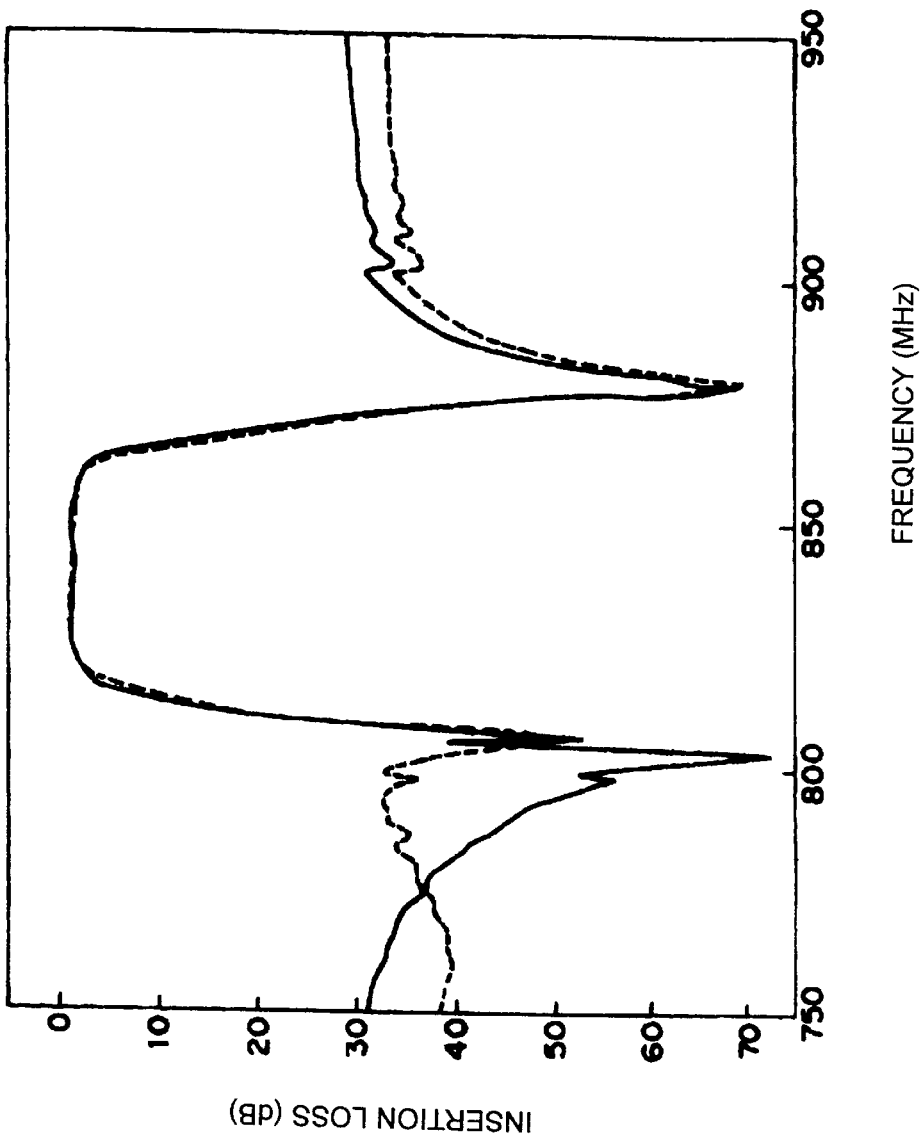
FIG. 20 is a diagram showing filtering characteristics of the surface acoustic wave filters according to the first and third preferred embodiments of the present invention.

FIG. 18 is the circuit construction of a surface acoustic wave filter according to a third preferred embodiment and FIG. 19 is a schematic plan view of a surface acoustic wave filter unit according to the third preferred embodiment contained in the package.

In the surface acoustic wave filter, a wiring electrode 21a establishes electrical connection between the parallel arm resonator 3a and the parallel arm resonator 3d, and a wiring electrode 22b establishes electrical connection between the parallel arm resonator 3c and the parallel arm resonator 3f. Terminals of parallel arm resonators 3b and 3e which are not connected to the first signal line or the second signal line are connected to the terminal electrodes 5b and 5e via bonding wires 26a and 26b, respectively. Otherwise, the surface acoustic wave filter according to the third preferred embodiment is preferably constructed in a similar manner as in the first preferred embodiment.

Each of the series arm resonators 2a to 2d and the parallel arm resonators 3a to 3f has the specifications described in Table 1. In addition, the bonding wires 26a and 26b have an inductance of approximately 1 nH.

In the surface acoustic wave filter according to the third preferred embodiment, two third parallel arm resonators are provided in each parallel arm. By inserting the inductance between the two parallel arm resonators, without spoiling the balance, greatly improved filtering characteristics are obtained.

Particularly, since, as in the second preferred embodiment, the parallel arm resonators 3b and 3e are connected via the bonding wires 26a and 26b and the wiring of the package, a high inductance of approximately 2.5 nH is inserted between the parallel arm resonators 3b and 3e.

On the other hand, in the third preferred embodiment, since the wiring electrodes 21a and 21b establish electrical connection between the parallel arm resonators 3c and 3d and electrical connection between the parallel arm resonators 3c and 3f, respectively, inductances are not inserted therebetween.

Accordingly, due to the parallel arm in which the parallel arm resonators 3b and 3e are inserted, attenuation is greatly improved. Due to the parallel arm to which the parallel arm resonators 3a and 3d are connected, and the parallel arm to which the parallel arm resonators 3c and 3f are connected, the steepness in the proximity of the passband is greatly enhanced.

Figure 23:
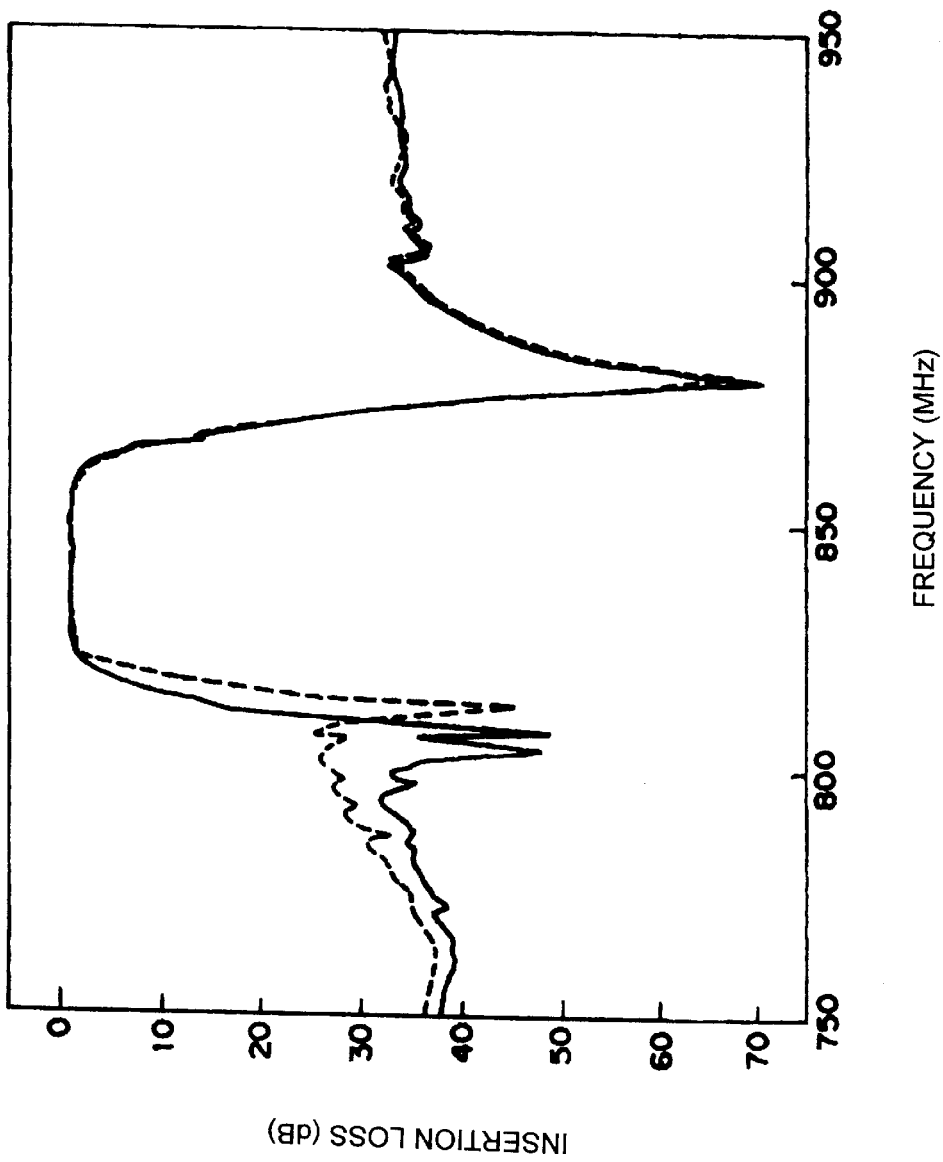
FIG. 23 is a diagram showing filtering characteristics of the surface acoustic wave filters according to the third and fourth preferred embodiments of the present invention.

FIG. 23 is a diagram showing filtering characteristics of the third preferred embodiment and filtering characteristics of the first preferred embodiment. The dashed line represents the filtering characteristics of the surface acoustic wave filter according to the third preferred embodiment and the solid line represents the filtering characteristics of the surface acoustic wave filter according to the first preferred embodiment. As is obvious from FIG. 23, although the third preferred embodiment has substantially the same steepness as the first preferred embodiment, the filtering characteristics of the third preferred embodiment has increased attenuation in a range of frequencies away from the passband.

Figure 21:
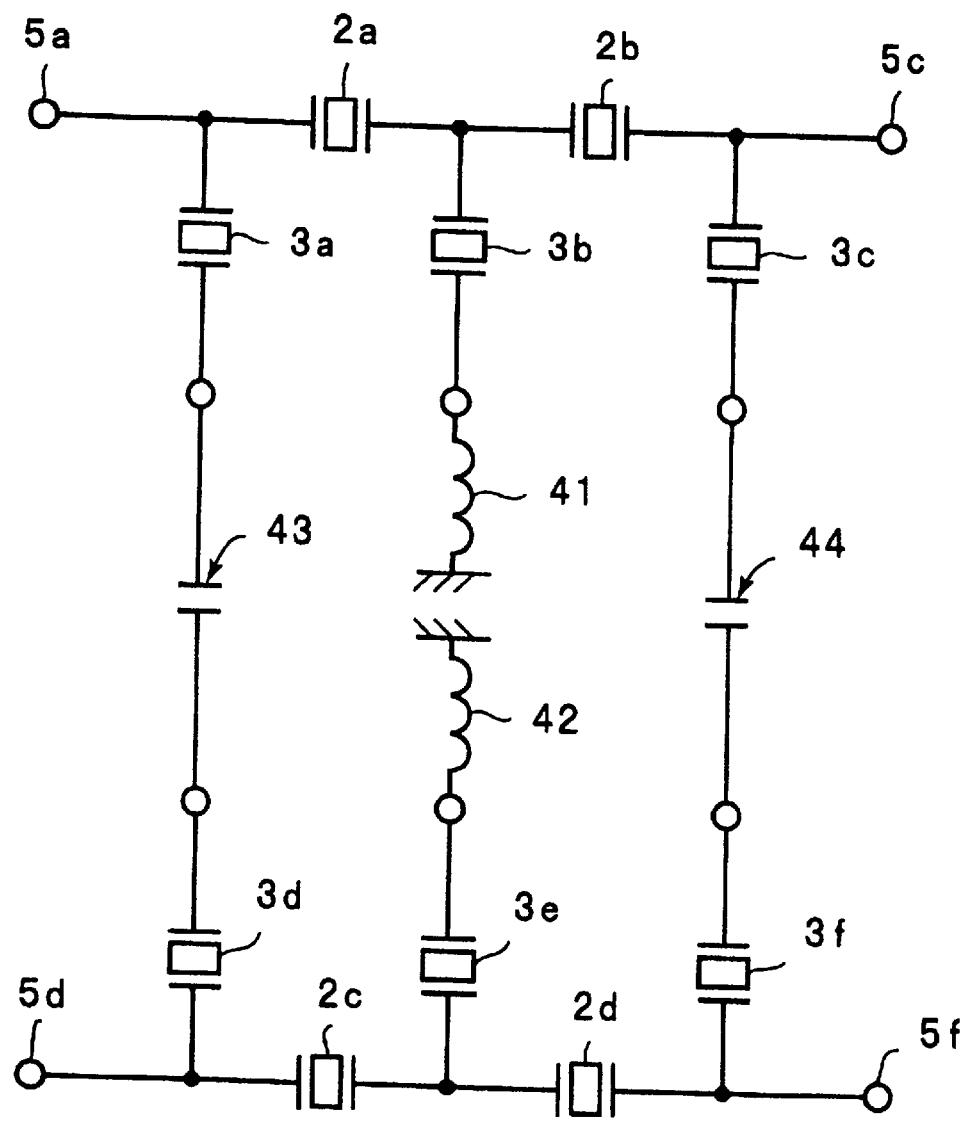
FIG. 21 is a diagram showing the circuit construction of a surface acoustic wave filter according to a fourth preferred embodiment of the present invention.
Figure 22:
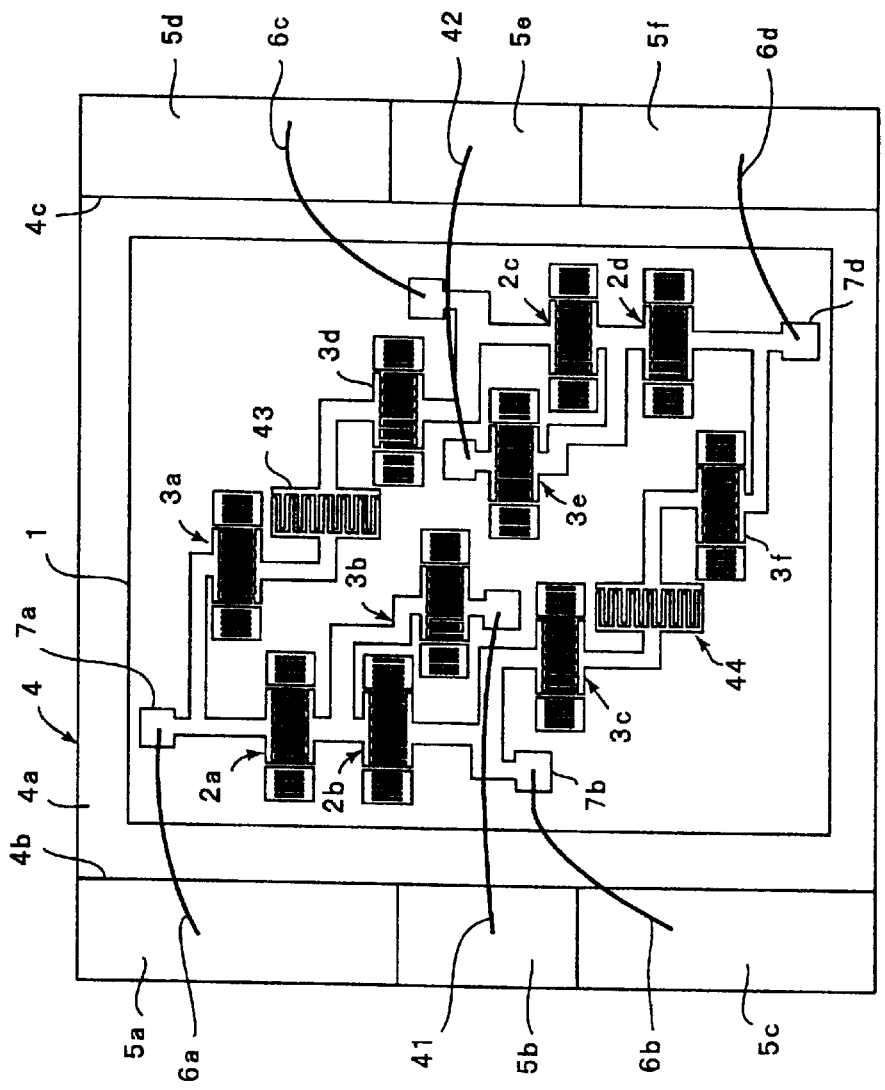
FIG. 22 is a schematic plan view illustrating the construction of the fourth preferred embodiment of the present invention.

FIG. 21 shows a circuit diagram showing the circuit construction of a surface acoustic wave filter according to a fourth preferred embodiment. FIG. 22 is a schematic plan view thereof. In the fourth preferred embodiment, the series arm resonators 2a to 2d and the parallel arm resonators 3a to 3f are constructed in the same manner as in the first preferred embodiment. It differs from the first preferred embodiment in that the parallel arm resonators 3b and 3e are connected to the terminals 5b and 5e connected via the bonding wires 41 and 42, respectively, to the ground potential and in that the parallel arm resonators 3a and 3d and the parallel arm resonators 3c and 3f are connected via comb electrodes 43 and 44, respectively.

The bonding wires 41 and 42 have an inductance of approximately 1 nH. The comb electrodes 43 and 44 each have a plurality of electrode fingers. They are provided such that the extending directions of the electrode fingers thereof are substantially perpendicular to the extending directions of the electrode fingers of the series arm resonators 2a to 2d and of the parallel arm resonators 3a to 3f, which are surface acoustic wave resonators. The comb electrodes 43 and 44 do not substantially excite surface acoustic waves and function as the capacitance elements. The capacitance values thereof are approximately 15 pF.

In the surface acoustic wave filter according to the fourth preferred embodiment, since capacitance of the above comb electrodes 43 and 44 is inserted between two third surface acoustic wave resonators connected to one parallel arm, that is, the parallel arm resonators, without altering the balance, filtering characteristics having a wideband and outstanding steepness is obtained.

Since the parallel arm resonators 3b and 3e are connected via the bonding wires 41 and 42 and electrode wiring of the package in the same manner as in the second preferred embodiment, higher inductance than that provided in the first preferred embodiment is inserted between the parallel arm resonators 3b and 3e.

On the other hand, the parallel arm resonators 3a and 3d and the parallel arm resonators 3c and 3f are connected via the above comb electrodes 43 and 44, respectively.

Therefore, due to an action of the parallel arm connected to the parallel arm resonators 3b and 3e, the attenuation is greatly improved. Due to an action of the parallel arm connected to the parallel arm resonators 3a and 3d and an action of the parallel arm connected to the parallel arm resonators 3c and 3f, the steepness in the proximity of the passband is greatly enhanced.

FIG. 23 shows filtering characteristics (the dashed line) of a surface acoustic wave filter according to the fourth preferred embodiment and, for comparison, filtering characteristics (the solid line) of the surface acoustic wave filter according to the third preferred embodiment. FIG. 23 illustrates that, in the fourth preferred embodiment, the steepness of the filtering characteristics is enhanced more than in the third preferred embodiment and increased attenuation is obtained in a range of frequencies away from the passband.

Figure 24:
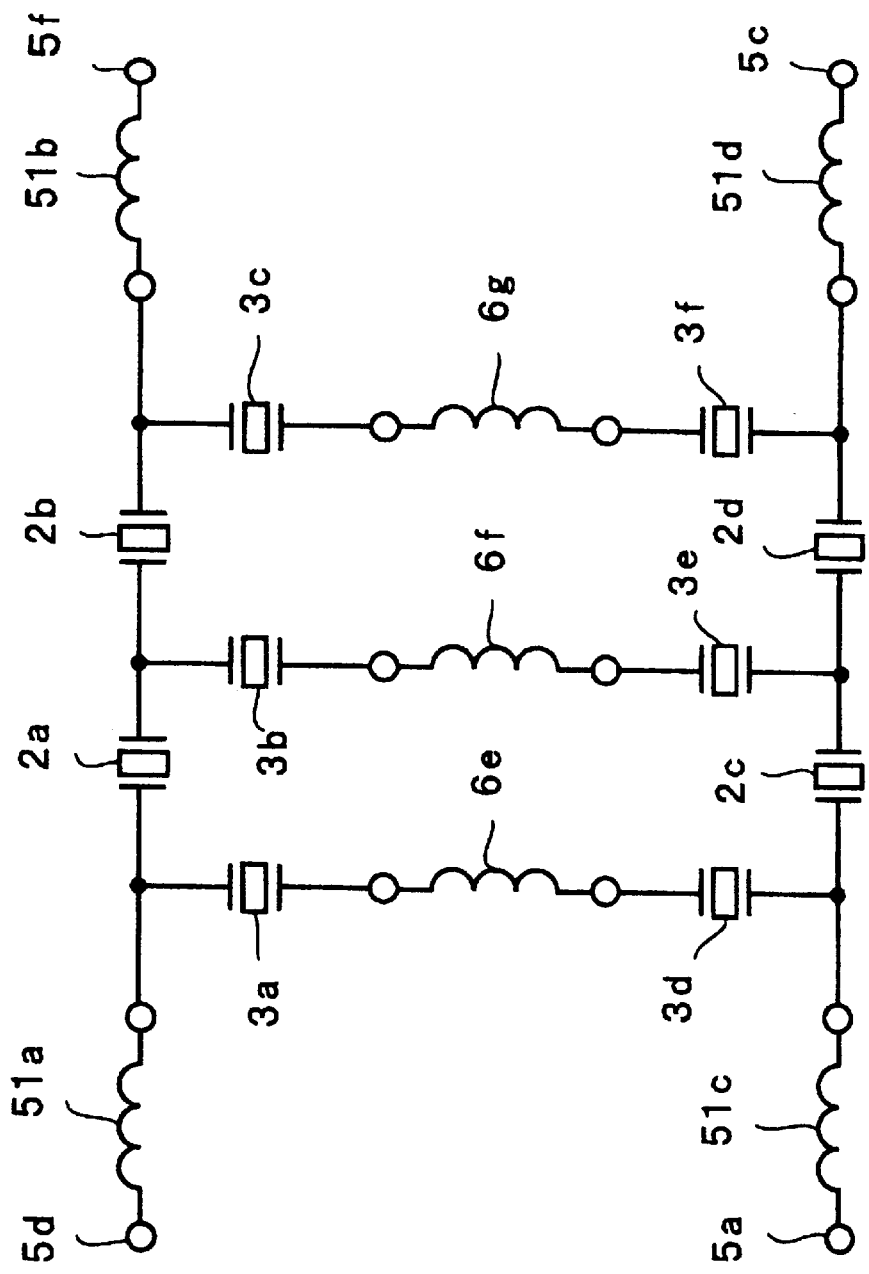
FIG. 24 is a diagram showing the circuit construction of a surface acoustic wave filter according to a fifth preferred embodiment of the present invention.
Figure 25:
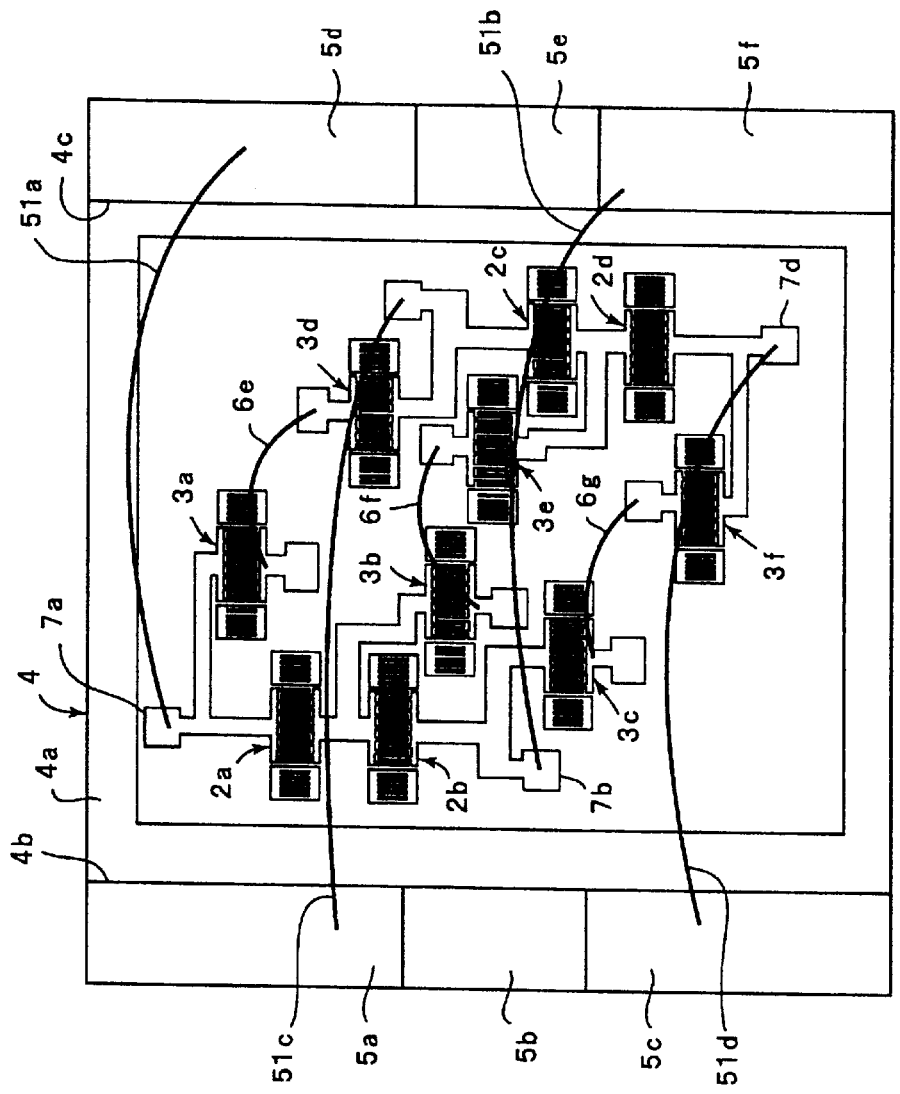
FIG. 25 is a schematic plan view illustrating the construction of fifth preferred embodiment of the present invention.

FIG. 24 shows the circuit construction of a surface acoustic wave filter according to a fifth preferred embodiment and FIG. 25 is a schematic plan view of the construction thereof.

In the fifth preferred embodiment, the construction of the piezoelectric substrate and the construction of each of the resonators are preferably similar to those of the counterparts in the first preferred embodiment. In the fifth preferred embodiment, the series arm resonators 2a to 2d and the terminals 5a to 5d provided in the package are connected via bonding wires 51a to 51d, respectively. The connection patterns thereof are different from those of the first preferred embodiment.

That is, the series arm resonator 2a is connected to the balanced signal terminal 5d via the bonding wire 51a, and the series arm resonator 2b is connected to the balanced signal terminal 5f via the bonding wire 51b. On the other hand, the series arm resonator 2c connected to the second signal line is connected to the balanced signal terminal 5a via the bonding wire 51c, and the series arm resonator 2d is connected to the balanced signal terminal 5c via the bonding wire 51d. Here, the balanced signal terminals 5a and 5c are provided on the projection 4b that is opposite to a side in which the series arm resonators 2c and 2d disposed on the piezoelectric substrate 1. Likewise, the balanced signal terminals 5d and 5f are provided on the projection 4c that is opposite to the side in which the series arm resonators 2a and 2b connected to the first signal line are provided. Therefore, the lengths of the bonding wires 51a to 51d are longer than those of the corresponding bonding wires 6a to 6d in the first preferred embodiment. An inductance of approximately 2 nH is inserted between the corresponding series arm resonators and balanced signal terminals.

Otherwise, it is constructed in the same manner as in the first preferred embodiment.

In the surface acoustic wave filter according to the fifth preferred embodiment, the bonding wires 51a to 51d, which connect the corresponding series arm resonators and balanced signal terminals, function as an inductance component in a high frequency domain. When wiring is performed using the bonding wires, an inductance component based on the bonding wires is inserted. The value of the inductance is in proportion to the length of the bonding wire. Accordingly, as shown in the fifth preferred embodiment, by extending the length of the bonding wire connected to the series arm resonator, higher inductance is inserted in series with the series arm resonator.

Figure 26:
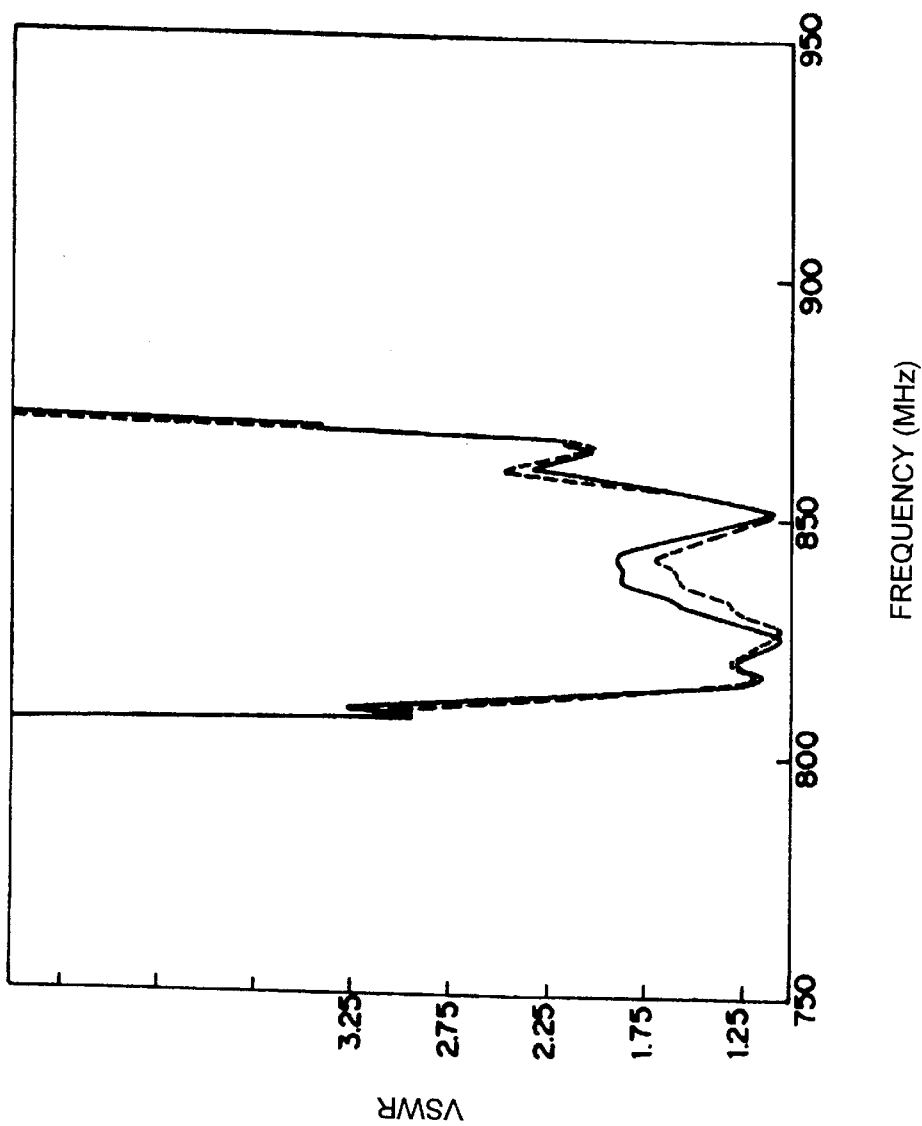
FIG. 26 is a diagram showing VSWR characteristics of the surface acoustic wave filters according to the first and fifth preferred embodiments of the present invention.
Figure 27:
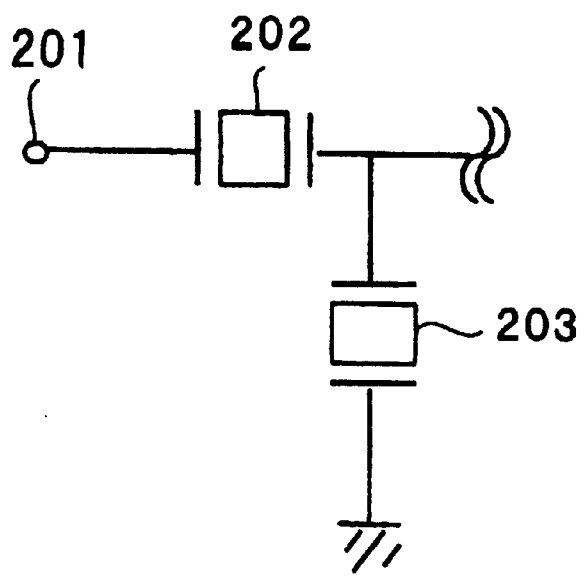
FIG. 27 is a circuit diagram illustrating a conventional ladder surface acoustic wave filter.
Figure 28:
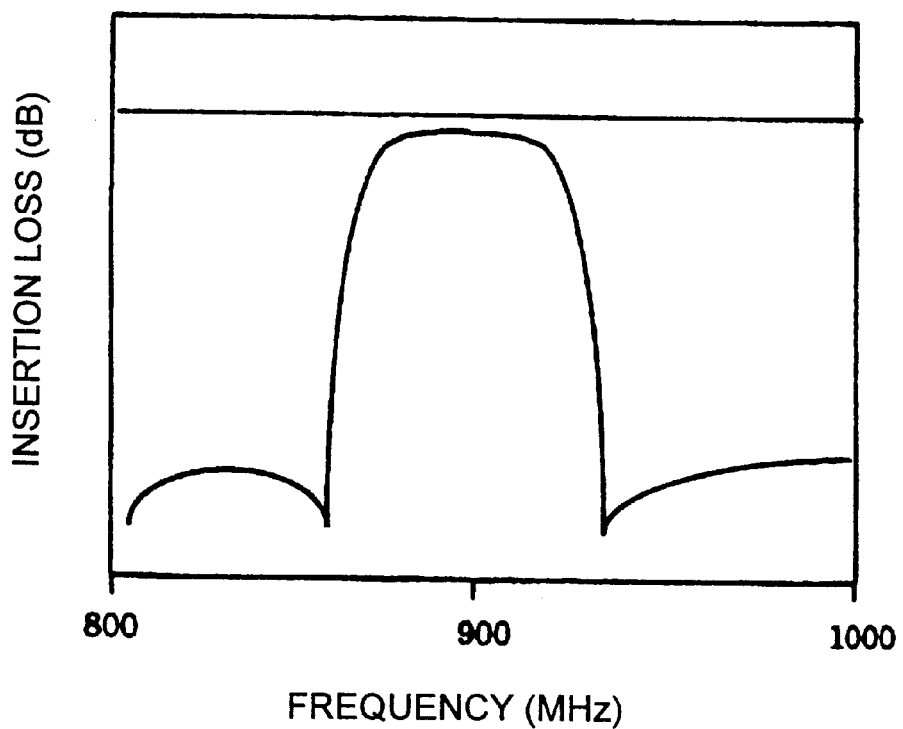
FIG. 28 is a diagram showing example characteristics of a conventional resonating surface acoustic wave filter.
Figure 29:
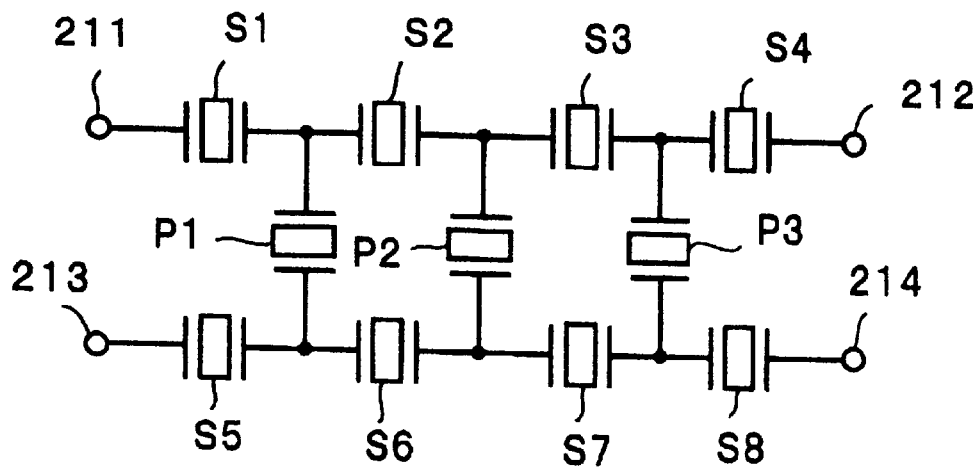
FIG. 29 is a circuit diagram showing another example of the conventional ladder surface acoustic wave filter.
Figure 30:
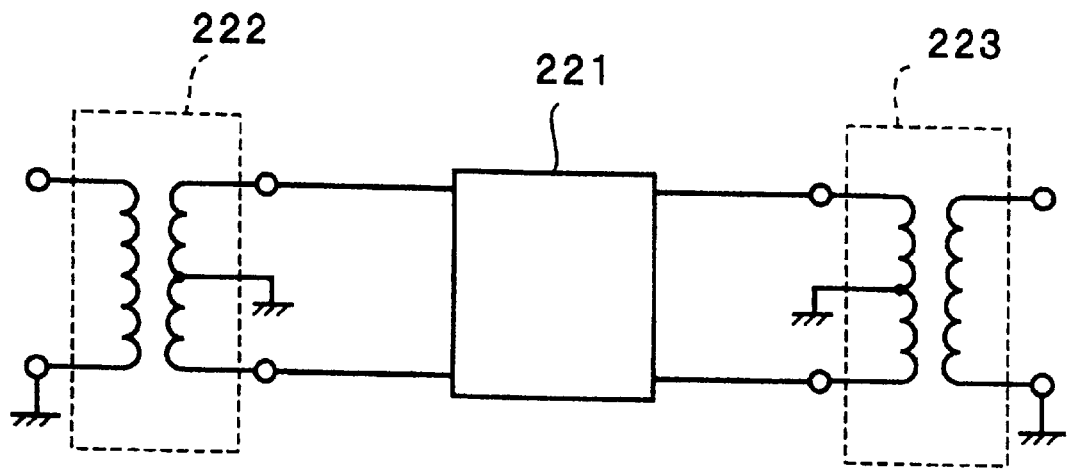
FIG. 30 is a block diagram showing a circuit that measures filtering characteristics thereof.

FIG. 26 shows each of the VSWR characteristics of the surface acoustic wave filter according to the fifth preferred embodiment and the surface acoustic wave filter according to the first preferred embodiment. In FIG. 26, the dashed line shows the result obtained by the fifth preferred embodiment and the solid line shows the result obtained by the first preferred embodiment. As is obvious from FIG. 26, it is understood that the surface acoustic wave filter according to the fifth preferred embodiment is improved in terms of the VSWR compared to that of the surface acoustic wave filter according to the first preferred embodiment.

Although 36° $LiTaO_3$ substrate is used as the piezoelectric substrate in the above-described first through fifth preferred embodiments, other piezoelectric substrates may be used.

The number of parallel arm resonators and the number of series arm resonators are not restricted. The basic construction of various preferred embodiments of the present invention is the construction which has two series arm resonators connected to a series arm and has an impedance element connected to a parallel arm. A series arm resonator or a parallel arm resonator may be properly connected to this basic construction.

Although the inductance is inserted using the inductance component of the wire bonding in the above-described embodiments, the inductance may be inserted using a wiring electrode in the package or using a strip line.

In the third preferred embodiment, the two parallel arm resonators are connected in the wiring electrode of the piezoelectric substrate to avoid the inductance component between a portion of the parallel arm resonators. When the impedance is not inserted, the two parallel arm resonators may be replaced with a single parallel arm resonator. Even in a flip-chip-bonding surface acoustic wave resonator, the inductance may be discretely constructed on the piezoelectric substrate or in the package.

In the present invention, to enhance the balance, it is desirable that, in the package, the parasitic capacitance of the input terminal and that of the output terminal be equal, and the input terminal and the output terminal have the same construction.

As explained above, in a surface acoustic wave filter according to various preferred embodiments of the present invention, a first signal line establishing connection between an input-side balanced signal terminal A1 and an output-sided balanced signal terminal B1 and a second signal line establishing connection between an input-side balanced signal terminal A2 and an output-side balanced signal terminal B2 are connected to at least one impedance element therebetween. Therefore, the surface acoustic wave filter is provided having wideband or narrowband filtering characteristics as well as a ladder circuit construction corresponding to balanced input/output. When the same impedance element is added, greatly improved filtering characteristics, which cannot be realized by a conventional unbalanced ladder surface acoustic wave filter, are obtained.

The impedance element is inserted in a parallel arm which establishes connection between the first signal line and the second signal line. In this case, at least one third surface acoustic wave resonator is connected to the parallel arm. In addition, at least two third surface acoustic wave elements are provided with it.

In a surface acoustic wave filter according to another preferred embodiment, at least one third surface acoustic wave resonator is led from each of the first signal line and the second signal line. Terminals of the third surface acoustic wave resonators which are not connected to the first signal line or the second signal line are grounded, to be connected.

Therefore, due to a construction in which third surface acoustic wave resonators are connected via the ground potential, a surface acoustic wave filter having an unbalanced input/output is provided. Due to the uniqueness of its construction, greatly improved filtering characteristics are obtained as compared with those of the surface acoustic wave filter having the conventional unbalanced ladder circuit construction. In addition, filtering characteristics can be measured using the unbalanced measuring circuit.

Furthermore, each resonator is designed to be symmetric as observed from a ground terminal. By measuring only one side of a filter unit, filtering characteristics of the other side thereof can be determined, which greatly reduces measuring cost. In addition, when it operates in a balanced circuit, the balance is greatly increased.

In the second surface acoustic wave filter, when the impedance element is inserted between terminals of third surface acoustic wave resonators which are on the sides connected to either the first signal line or the second signal line and the ground potential, the third surface acoustic wave resonators connected to the parallel arm are grounded via the impedance element. Therefore, it achieves balanced input/output, has wideband or narrowband filtering characteristics that are capable of being accurately measured, and filtering characteristics that can be measured without using a balance-to-unbalance transformer.

In the surface acoustic wave device according to the second preferred embodiment, when the electrode capacitance ratio of two third surface acoustic wave resonators which are each led from the first signal line and the second signal line and which each define identical parallel arms is approximately 1.4 or below, greatly improved filtering characteristics are measured and greatly improved balance is achieved.

When at least one second impedance element is provided which is connected in series with a first series arm surface acoustic wave resonator between the input-side balanced signal terminal A1 and the output-side balanced signal terminal B1 and a third impedance element which is connected in series with a second series arm surface acoustic wave resonator between the input-side balanced signal terminal A2 and the output-side balanced signal terminal B2, since the impedance element is added to not only the parallel arm but also the series arm, greatly improved filtering characteristics are obtained. In particular, VSWR characteristics are greatly improved.

While preferred embodiments of the invention have been disclosed, various modes of carrying out the principles disclosed herein are contemplated as being within the scope of the following claims. Therefore, it is understood that the scope of the present invention is not to be limited except as otherwise set forth in the claims.

What is claimed is:

1. A surface acoustic wave filter comprising:
    a piezoelectric substrate; and
    a plurality of surface acoustic wave resonators provided on said piezoelectric substrate and connected to define a ladder filter circuit;
    wherein the ladder filter circuit includes:
        input-side balanced signal terminals A1 and A2 connected to an external balanced circuit;
        output-side balanced signal terminals B1 and B2 connected to an external balanced circuit;
        at least one first series arm surface acoustic wave resonator connected in series between said input-side balanced signal terminal A1 and said output-side balanced signal terminal B1;
        at least one second series arm surface acoustic wave resonator connected in series between said input-side balanced signal terminal A2 and said output-side balanced signal terminal B2; and
        at least one impedance element connected between a first signal line connecting said input-side balanced signal terminal A1 to said output-side balanced signal terminal B1 and a second signal line connecting said input-side balanced signal terminal A2 to said output-side balanced signal terminal B2; wherein
    said at least one impedance element is a capacitance element.

2. A surface acoustic wave filter according to claim 1, further comprising at least one third surface acoustic wave resonator connected in series with the at least one impedance element.

3. A surface acoustic wave filter according to claim 2, comprising at least two of said third surface acoustic wave resonators.

4. A surface acoustic wave filter according claim 1, further comprising:
    at least one second impedance element connected in series with the at least one first series arm surface acoustic wave resonator between said input-side balanced signal terminal A1 and said output-side balanced signal terminal B1; and
    a third impedance element connected in series with the at least one second series arm surface acoustic wave resonator between the input-side balanced signal terminal A2 and the output-side balanced signal terminal B2.

5. A surface acoustic wave filter according to claim 1, wherein said capacitance element includes an electrode disposed on said piezoelectric substrate.

6. A surface acoustic wave filter comprising:
    a piezoelectric substrate; and
    a plurality of surface acoustic wave resonators provided on said piezoelectric substrate and connected to define a ladder filter circuit;
    wherein the ladder filter circuit includes:
        input-side balanced signal terminals A1 and A2 connected to an external balanced circuit;
        output-side balanced signal terminals B1 and B2 connected to an external balanced circuit;
        at least one first series arm surface acoustic wave resonator connected in series between said input-side balanced signal terminal A1 and said output-side balanced signal terminal B1;
        at least one second series arm surface acoustic wave resonator connected in series between said input-side balanced signal terminal A2 and said output-side balanced signal terminal B2;
        at least one inductance element connected between a first signal line connecting said input-side balanced signal terminal A1 to said output-side balanced signal terminal B1 and a second signal line connecting said input-side balanced signal terminal A2 to said output-side balanced signal terminal B2; and
    at least two third surface acoustic wave resonators connected in series with the at least one inductance element; wherein
    one of said at least two third surface acoustic wave resonators is connected between said at least one inductance element and said first signal line and another of said at least two third surface acoustic wave resonators is connected between said at least one inductance element and said second signal line such that said one of said at least two third surface acoustic wave resonators is directly connected to said first signal line and the other of said at least two third surface acoustic wave resonators is directly connected to said second signal line.

7. A surface acoustic wave filter comprising:

a piezoelectric substrate; and a plurality of surface acoustic wave resonators provided on said piezoelectric substrate and connected to define a ladder filter circuit;

wherein the filter circuit includes:
input-side balanced signal terminals A1 and A2 connected to an external balanced circuit;
output-side balanced signal terminals B1 and B2 connected to an external balanced circuit;
at least one first series arm surface acoustic wave resonator connected in series between said input-side balanced signal terminal A1 and said output-side balanced signal terminal B1;
at least one second series arm surface acoustic wave resonator connected in series between said input-side balanced signal terminal A2 and said output-side balanced signal terminal B2;

at least two third surface acoustic wave resonators each led from a first signal line connecting said input-side balanced signal terminal A1 to said output-side balanced signal terminal B1 and a second signal line connecting said input-side balanced signal terminal A2 to said output-side balanced signal terminal B2, wherein a terminal of at least one of said at least two third surface acoustic wave resonators which is not connected to said first signal line or said second signal line is grounded; and an impedance element inserted between the terminal of the third surface acoustic wave resonator which is not connected to said first signal line or said second signal line and a ground potential; wherein said impedance element includes a capacitance element.

8. A surface acoustic wave filter according to claim 7, wherein the ratio of the electrode capacitance of one of the at least two third surface acoustic wave resonators led from the first signal line and the second signal line to the electrode capacitance of another of the at least two third surface acoustic wave resonators led from the second signal line and the first signal line is not more than approximately 1.4.

9. A surface acoustic wave filter according claim 7, further comprising:

at least one second impedance element connected in series with the at least one first series arm surface acoustic wave resonator between said input-side balanced signal terminal A1 and said output-side balanced signal terminal B1; and a third impedance element connected in series with the at least one second series arm surface acoustic wave resonator between the input-side balanced signal terminal A2 and the output-side balanced signal terminal B2.

10. A surface acoustic wave filter according to claim 7, wherein said capacitance element includes an electrode disposed on said piezoelectric substrate.

11. A surface acoustic wave filter comprising:

a piezoelectric substrate; and a plurality of surface acoustic wave resonators provided on said piezoelectric substrate and connected to define a ladder filter circuit;

wherein the filter circuit includes:
input-side balanced signal terminals A1 and A2 connected to an external balanced circuit;
output-side balanced signal terminals B1 and B2 connected to an external balanced circuit;
at least one first series arm surface acoustic wave resonator connected in series between said input-side balanced signal terminal A1 and said output-side balanced signal terminal B1;
at least one second series arm surface acoustic wave resonator connected in series between said input-side balanced signal terminal A2 and said output-side balanced signal terminal B2; and at least two third surface acoustic wave resonators each led from a first signal line connecting said input-side balanced signal terminal A1 to said output-side balanced signal terminal B1 and a second signal line connecting said input-side balanced signal terminal A2 to said output-side balanced signal terminal B2, wherein a terminal of at least one of said at least two third surface acoustic wave resonators which is not connected to said first signal line or said second signal line is grounded; and an impedance element inserted between the terminal of the third surface acoustic wave resonator which is not connected to said first signal line or said second signal line and a ground potential; wherein said impedance element includes a resonating element.

12. A surface acoustic wave filter according to claim 11, wherein said resonating element includes inductance and capacitance.

* * * * *